(12) United States Patent
Philipp et al.

(10) Patent No.: US 8,619,054 B2
(45) Date of Patent: Dec. 31, 2013

(54) TWO DIMENSIONAL POSITION SENSOR

(75) Inventors: Harald Philipp, Drogheda (IE); Luben Hristov, Sofia (BG)

(73) Assignee: Atmel Corporation, San Jose, CA (US)

( * ) Notice: Subject to any disclaimer, the term of this patent is extended or adjusted under 35 U.S.C. 154(b) by 1094 days.

(21) Appl. No.: 11/752,615

(22) Filed: May 23, 2007

(65) Prior Publication Data

US 2007/0279395 A1    Dec. 6, 2007

Related U.S. Application Data

(60) Provisional application No. 60/803,510, filed on May 31, 2006.

(51) Int. Cl.
| | |
|---|---|
| *G06F 3/041* | (2006.01) |
| *G06F 3/045* | (2006.01) |
| *G06F 3/044* | (2006.01) |
| *G08C 21/00* | (2006.01) |

(52) U.S. Cl.
USPC ........................................ 345/174; 178/18.06

(58) Field of Classification Search
USPC ................. 345/174–175; 178/18.06
See application file for complete search history.

(56) References Cited

U.S. PATENT DOCUMENTS

| | | | |
|---|---|---|---|
| 2,338,949 A | 1/1944 | Kuepfmueller | |
| 2,925,467 A | 2/1960 | Becker | |
| 3,699,439 A | 10/1972 | Turner | |
| 3,921,166 A | 11/1975 | Volpe | |
| 4,198,539 A | 4/1980 | Pepper, Jr. | |
| 4,264,903 A * | 4/1981 | Bigelow ............................. | 341/1 |
| 4,293,734 A | 10/1981 | Pepper, Jr. | |
| 4,371,746 A | 2/1983 | Pepper, Jr. | |
| 4,649,232 A | 3/1987 | Nakamura et al. | |
| 4,650,926 A | 3/1987 | Nakamura et al. | |

(Continued)

FOREIGN PATENT DOCUMENTS

| | | |
|---|---|---|
| CN | 1708672 A | 12/2005 |
| DE | 203719 | 11/1907 |

(Continued)

OTHER PUBLICATIONS

"German Application No. 10 2007 023 853.5, German Office Action (with English translation) mailed Jan. 29, 2010", 5 pgs.

(Continued)

*Primary Examiner* — Amr Awad
*Assistant Examiner* — Andre Matthews
(74) *Attorney, Agent, or Firm* — Baker Botts LLP

(57) ABSTRACT

A two-dimensional position sensor comprising a substrate with a sensitive area defined by a pattern of electrodes including electrodes for determining x-position and electrodes for determining y-position. The x-electrodes and y-electrodes generally extend in the x-direction and are interleaved in the y-direction. The x-electrodes comprise at least first, second and third groups of elements shaped such that adjacent ones of the elements of the different x-electrode groups co-extend in the x-direction so that the x-electrodes provide ratiometric capacitive signals, thereby providing quasi-continuous x-position sensing across the sensitive area. In addition, the y-electrodes may be resistively connected or arranged in ratiometric pairs to provide quasi-continuous y-position sensing. Alternatively, the x-electrode groups may be interdigitated to form pairs of x-adjacent blocks of differing area to provide stepwise x-position sensing in combination with stepwise y-position sensing provided by the y-electrodes.

20 Claims, 16 Drawing Sheets

(56) References Cited

U.S. PATENT DOCUMENTS

| | | |
|---|---|---|
| 4,659,874 A | 4/1987 | Landmeier |
| 4,678,869 A | 7/1987 | Kable |
| 4,680,430 A | 7/1987 | Yoshikawa et al. |
| 4,686,332 A | 8/1987 | Greanias et al. |
| 4,733,222 A | 3/1988 | Evans |
| 4,822,957 A | 4/1989 | Talmage, Jr. et al. |
| 4,827,084 A | 5/1989 | Yaniv et al. |
| 5,101,081 A | 3/1992 | Drumm |
| 5,149,919 A | 9/1992 | Greanias et al. |
| 5,157,227 A | 10/1992 | McDermott et al. |
| 5,181,030 A | 1/1993 | Itaya et al. |
| 5,305,017 A | 4/1994 | Gerpheide |
| 5,381,160 A | 1/1995 | Landmeier |
| 5,438,168 A | 8/1995 | Wolfe et al. |
| 5,463,388 A | 10/1995 | Boie et al. |
| 5,650,597 A * | 7/1997 | Redmayne ............... 178/18.06 |
| 5,730,165 A | 3/1998 | Philipp |
| 5,844,506 A | 12/1998 | Binstead |
| 5,914,465 A | 6/1999 | Allen et al. |
| 5,940,065 A | 8/1999 | Babb et al. |
| 6,137,427 A | 10/2000 | Binstead |
| 6,222,522 B1 | 4/2001 | Mathews et al. |
| 6,288,707 B1 | 9/2001 | Philipp |
| 6,297,811 B1 | 10/2001 | Kent |
| 6,452,514 B1 | 9/2002 | Philipp |
| 6,506,983 B1 | 1/2003 | Babb et al. |
| 6,535,200 B2 | 3/2003 | Philipp |
| 7,151,528 B2 * | 12/2006 | Taylor et al. ............... 345/168 |
| 7,218,124 B1 * | 5/2007 | Mackey et al. ............. 324/660 |
| 7,663,607 B2 | 2/2010 | Hotelling |
| 7,875,814 B2 | 1/2011 | Chen |
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 2005/0270039 A1 | 12/2005 | Mackey |
| 2007/0181424 A1 * | 8/2007 | Frey et al. ............... 204/403.01 |
| 2007/0279395 A1 * | 12/2007 | Philipp et al. ............... 345/173 |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

FOREIGN PATENT DOCUMENTS

| | | |
|---|---|---|
| DE | 3722890 A1 | 1/1989 |
| GB | 1546317 A | 5/1979 |
| JP | 2006-12110 A | 1/2006 |
| TW | 341684 | 10/1998 |
| WO | 98/05025 A1 | 2/1998 |
| WO | 00/79384 A1 | 12/2000 |
| WO | 2004/040240 | 5/2004 |
| WO | 2005/020056 | 3/2005 |
| WO | 2005/121940 A2 | 12/2005 |
| WO | WO 2012/129247 | 9/2012 |

OTHER PUBLICATIONS

Search Report of Aug. 16, 2007 in corresponding application GB0708359.5.
GB Patent Office search report of Sep. 19, 2006.
"Chinese Application No. 200710108809.6, Office Action mailed Aug. 24, 2010", 4 pgs.
"German Application No. 10 2007 023 853.5, Office Action mailed Dec. 22, 2009", (w/ English Translation), 5 pgs.
"German Application No. 10 2007 023 853.5, Response filed Apr. 13, 2010 to Office Action mailed Dec. 22, 2009", (w/ English Translation of Claim 1), 5 pgs.
Office Action and English Translation of German Patent Application 10 2007 023 85.5, Apr. 27, 2012.
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.
Office Action of the Intellectual Property Office for ROC (Taiwan) Patent Application No. 096118385, Feb. 25, 2013.

* cited by examiner

TWO DIMENSIONAL POSITION SENSOR

BACKGROUND OF THE INVENTION

The invention relates to 2-dimensional capacitive position sensors, typically actuated by a human finger, or a stylus. Example devices include touch screens and touch pads, particularly those over liquid crystal displays (LCDs), or cathode ray tubes (CRTS) and other types of displays, or pen-input tablets, or encoders used in machinery for feedback control purposes. Descriptions of pen or touch input to a machine date back to at least 1908, as embodied in patent DE 203,719.

Touch screens and pointing devices have become increasingly popular and common not only in conjunction with personal computers but also in all manner of other appliances such as personal digital assistants (PDAs), point of sale (POS) terminals, electronic information and ticketing kiosks, kitchen appliances and the like. These devices are evolving continuously into lower priced products and as a result, there is a need for ever lower production cost while maintaining high levels of quality and robustness.

Touch screens generally fall into two categories, capacitive and resistive.

For capacitive devices, the term 'two-dimensional capacitive transducer' or '2DCT' is used as a generic term for touch screens, touch sensing pads, proximity sensing areas, display overlay touch screens over LCD, plasma, or CRT screens or the like, position sensing for mechanical devices or feedback systems, or other types of control surfaces without limitation, having a surface or volume capable of reporting at least a 2-dimensional coordinate, Cartesian or otherwise, related to the location of an object or human body part, by means of a capacitance sensing mechanism.

For resistive devices, the term 'two-dimensional resistive transducer' or '2DRT' is used as a generic term to refer to touch screens or pen input devices based on purely galvanic principles.

The term '2DxT' refers to elements of either the 2DCT or 2DRT type.

The term 'touch' means touch or proximity by a human body part or mechanical component of sufficient capacitive signal strength to generate a desired output. In the sense of 'proximity', touch can also mean to 'point' at a 2DCT without making physical contact, where the 2DCT responds to the capacitance from the proximity of the object sufficient to react properly.

The term 'element' refers to the active sensing element of a 2DCT or 2DRT. The term 'electrode' refers to a connection point at the periphery of the element.

The term 'stripe' refers to an electrical line conductor that is a component part of an element and which has two ends. A stripe can be a wire. A stripe can have substantial galvanic resistance by intent, whereas a wire has minimal resistance. If the element of which it is a part is physically curved, the stripe would also be physically curved.

The term 'pin cushion' refers to any distortion of the signal from a 2DCT whether parabolic, barrel, or other form of 2D dimensional aberration.

Many types of 2DCT are known to suffer from geometric distortion characterized as 'pin cushion' or 'hyperbolic' or 'parabolic', whereby the reported coordinate of touch is in error due to electrical effects on the sensing surface. These effects are described in more depth in various other patents, for example in Pepper U.S. Pat. No. 4,198,539, incorporated by reference. An excellent summary of the known causes, solutions, and problems of the solutions to geometric distortion can be found in a reading of Babb et al, in U.S. Pat. No. 5,940,065 and U.S. Pat. No. 6,506,983, incorporated by reference. U.S. Pat. No. 5,940,065 describes succinctly the two major classes of correction: 1) Electromechanical methods involving design of or modification to the sensing surface or the connecting electrodes; 2) Modeling methods using mathematical algorithms to correct the distortions.

Electromechanical Methods

Edge Manipulation of Planar Element: Küpfmüller et al in U.S. Pat. No. 2,338,949 (filed 1940) solve the problem of edge distortion in a 2DRT electrograph using very long rectangular tails in X and Y surrounding a small usable area. Küpfmüller takes the further approach of slotting the four tails into stripes; these stripes do not intrude on the user input area but do act to raise the resistance to current flow in an anisotropic manner along sides parallel to current flow. This idea reappears in slightly different form in Yaniv et al, U.S. Pat. No. 4,827,084, nearly 50 years later. Küpfmüller remains the most similar prior art to the instant invention.

Becker in U.S. Pat. No. 2,925,467 appears the first to describe a 2DRT electrograph whereby nonlinear edge effects are eliminated via the use of a very low resistance edge material relative to the sheet resistance of the element proper. This method can also be used to construct a 2DCT.

Pepper, in U.S. Pat. No. 4,198,539, U.S. Pat. No. 4,293,734, and U.S. Pat. No. 4,371,746 describes methods of linearizing a 2DCT by manipulating the edge resistance structure of the element.

Talmage, in U.S. Pat. No. 4,822,957 describes a similar edge pattern as Pepper in conjunction with a 2DRT element and a pick-off sheet. Numerous other such patents have been issued using various methods, and the area remains a fertile one for new patents to this day. These methods have been found to be very difficult to develop and replicate, and they are prone to differential thermal heating induced errors and production problems. Very small amounts of localized error or drift can cause substantial changes in coordinate response. The low resistance of the patterned edge strips causes problems with the driver circuitry, forcing the driver circuitry to consume more power and be much more expensive than otherwise. There are a significant number of patents that reference the Pepper patents and which purport to do similar things. The improvements delivered by Pepper etc over Becker are arguably marginal, as at least Becker is easier and more repeatable to fabricate.

Edge Resistance with Wire Element: Kable in U.S. Pat. No. 4,678,869 discloses a 2D array for pen input, using resistive divider chains on 2 axes with highly conductive electrodes connected to the chains, the electrodes having some unintended resistance for the purposes of detection, and the detection signal being interpolated from the signals generated between two adjacent electrodes. The unintended resistance causes a slight amount of pin cushion in the response. This patent also describes an algorithmic means to compensate for the slight pin-cushion distortion developed by this technique. The Kable method is not operable with other than a connected stylus, i.e. it is not described as being responsive to a human finger. The Kable patent requires crossovers between conductors and thus needs at least three construction layers (conductor, insulator, conductor).

Multiple Active-Edge Electrodes: Turner in U.S. Pat. No. 3,699,439 discloses a uniform resistive screen with an active probe having multiple electrode connections on all four sides to linearize the result.

Yoshikawa et al, in U.S. Pat. No. 4,680,430, and Wolfe, in U.S. Pat. No. 5,438,168, teach 2DCT's using multiple electrode points on each side (as opposed to the corners) to facilitate a reduction in pin cushion by reducing the interaction of the current flow from the electrodes on one axis with the electrodes of the other. While the element is a simple sheet resistor, this approach involves large numbers of active electronic connections (such as linear arrays of diodes or MOSFETs) at each connection point in very close proximity to the element.

Nakamura in U.S. Pat. No. 4,649,232 teaches similarly as Yoshikawa and Wolfe but with a resistive pickup stylus.

Sequentially Scanned Stripe Element: Greanias et al in U.S. Pat. No. 4,686,332 and U.S. Pat. No. 5,149,919, Boie et al in U.S. Pat. No. 5,463,388, and Landmeier in U.S. Pat. No. 5,381,160 teach methods of element sensing using alternating independently driven and sensed stripe conductors in both the X and Y axis, from which is interpreted a position of a finger touch or, by a pickup device, a stylus pen. The construction involves multiple layers of material and special processing. Greanias teaches the use of interpolation between the stripes to achieve higher resolution in both axis. Both require three or more layers to allow crossovers of conductors within the element. Both rely on measurements of capacitance on each stripe, not the amount of cross coupling from one stripe to another. Boie also teaches a special guard-plane.

Binstead, in U.S. Pat. No. 5,844,506 and U.S. Pat. No. 6,137,427 teaches a touch screen using discrete fine wires in a manner similar to those taught by Kable, Allen, Gerpheide and Greanias. Binstead uses very fine row and column wires to achieve transparency. This patent also teaches the Greanias method of interpolation between electrode wires to achieve higher resolution. The scanning relies on measurements of capacitance on each stripe to ground, not the amount of cross coupling from one to another.

Evans in U.S. Pat. No. 4,733,222 also describes a system wherein stripes are sequentially driven in both X and Y axis, using also an external array of capacitors to derive sensing signals via a capacitor divider effect. Interpolation is used to evaluate finer resolutions than possible with the stripes alone.

Volpe in U.S. Pat. No. 3,921,166 describes a discrete key mechanical keyboard that uses a capacitive scanning method. There are sequentially driven input rows and sequentially sensed columns. The press of a key increases the coupling from a row to a column, and in this way n-key rollover can be achieved; there is no need for interpolation. Although not a 2DCT, Volpe presages scanned stripe element 2DCT technology. My own U.S. Pat. No. 6,452,514 also falls into this classification of sensor.

Itaya in U.S. Pat. No. 5,181,030 discloses a 2DRT having resistive stripes which couple under pressure to a resistive plane which reads out the location of contact. The stripes, or the plane, have a 1D voltage gradient imposed on them so that the location of contact on particular the stripe can be readily identified. Each stripe requires its own, at least one electrode connection.

Cyclical Scanned Stripe Element: Gerpheide et al, in U.S. Pat. No. 5,305,017 teaches a touch-pad capacitance-based computer pointing device using multiple orthogonal arrays of overlapping metallic stripes separated by insulators. The scan lines are arranged in a cyclically repeating pattern to minimize drive circuitry requirements. A cyclical nature of the wiring of the invention prevents use of this type of 2DCT for absolute position location. The invention is suited to touch pads used to replace mice, where actual location determination is not required, and only relative motion sensing is important. Gerpheide teaches a method of signal balance between two phase-opposed signals at the location of touch.

Parallel Read Stripe Elements: Allen et al in U.S. Pat. No. 5,914,465 teach an element having rows and column scan stripes which are read in parallel by analog circuitry. The patent claims lower noise and faster response times than sequentially scanned elements. The method is particularly suited to touch pads for mouse replacement but does not scale well to higher sizes. Multiple construction layers are required as with all stripe element 2DCT's. The Allen method requires large scale integration and high numbers of connection pins. It interpolates to achieve higher resolution than achievable by the number of raw stripes.

In WO 04/040240, "Charge Transfer Capacitive Position Sensor", Philipp describes in conjunction with FIG. 12 a method of using individual resistive 1-D stripes to create a touch screen. These stripes can be read either in parallel or sequentially, since the connections to these stripes are independent of one another. Furthermore, in connection with FIG. 6 there is described an interpolated coupling between adjacent lumped electrode elements and an object such as a finger. WO 04/040240 is incorporated herein by reference.

In WO 2005/020056 Philipp describes a position sensor having first and second resistive bus-bars spaced apart with an anisotropic conductive area between them (see FIG. 3 thereof). Electric currents induced in the anisotropic conductive area by touch or proximity flow preferentially towards the bus-bars to be sensed by detection circuitry. Because induced currents, for example those induced by drive circuitry, flow preferentially along one direction, pin-cushion distortions in position estimates are largely constrained to this single direction. Such one-dimensional distortions can be corrected for very simply by applying scalar correction factors, thereby avoiding the need for complicated vector correction. This provides a 2D pattern of conductive material for sensing capacitance behind a plastic or glass panel or other dielectric, which can be used as a 2DxT, whether in the format of a touch screen or 'touch pad'. The conductor can be clear, for example made of indium tin oxide (ITO), to provide a suitable transparent overlay for a display or other backing.

This approach works well for relatively small screen sizes up to about a 2 inch (50 mm) diagonal suitable for a cellular telephone but performance degrades with larger screens such as needed for some white goods, for example a microwave oven. Moreover, the handshadow effect can cause problems with this design.

In U.S. Pat. No. 6,288,707 Philipp describes a capacitive position sensor intended to function as part of a computer pointing device that employs ratiometric capacitive sensing techniques. An array of patterned metallic electrodes is disposed on an insulating substrate layer, where the electrode geometry is selected to generate a varying capacitive output as a user's finger moves across the electrode array.

FIG. 1 of the accompanying drawings reproduces FIG. 4 of U.S. Pat. No. 6,288,707. An array of patterned metallic electrodes is disposed on an insulating layer where the electrode geometry is selected to generate a varying capacitive output as a user's finger moves across the electrode array. This arrangement comprises four interspersed electrode sets, two for each dimension. The x-axis sets, which are triangular, are easier to see and understand. A first set of triangles 1 are all electrically connected together to an output bus denoted as X1. The second set 2 are also connected together to an output labeled X2. The position of a user's hand with respect to the x-axis can be ascertained from the ratio of signals from X1 and X2. Because capacitance is directly proportional to surface area, and because the plates connected to X1 aggregate to a greater surface area to the left than do the plates connected to X2 (and vice versa) the ability to take the ratio of X1/X2 or X2/X1 is preserved so long as a great enough finger area is over the pattern at a close enough range to provide sufficient signal strength. A corresponding set of plates are connected to the Y1 and Y2 buses. The Y-connected set is also ratiometric, although in a manner different from the X sets. The Y set consists of alternating Y1-connected and Y2-connected rectangular stripes, 3 and 4 respectively, having a y-axis dimension that varies with placement in such a manner so as to create a smoothly varying ratio of surface area between Y1 and Y2 with location Y. The sum of each adjacent pair of the y-axis stripes 3 and 4 is made constant so that the sum of the capacitance is the same for any two paired stripes, i.e., C(Y1)+C(Y2)=C(Y) for each pair of stripes. Then, as the user's fingers move along the y-axis, the detected capacitance ratio is measured in the same manner as the CX1)/C(X2) ratio, i.e. the largest value becomes the numerator. However, this design offers limited capability for the 2DCT dimension in the x-direction.

Numerical Methods

Nakamura in U.S. Pat. No. 4,650,926 describes a system for numerical correction of an electrographic system such as a tablet, using a lookup table system to correct raw 2D coordinate data.

Drum, in U.S. Pat. No. 5,101,081 describes a system for numerical correction of an electrographic system such as a tablet via remote means.

McDermott in U.S. Pat. No. 5,157,227 teaches a numerical method of correcting a 2DxT employing stored constants which are used during operation to control one or more polynomials to correct the location of reported touch by zone or quadrant.

Babb et al, in U.S. Pat. Nos. 5,940,065 and 6,506,983 teach a numerical method to linearize a 2DxT uniform sheet element using coefficients determined during a learn process, without segmentation by zone or quadrant, and on an individual unit basis so as to correct for even minor process variations. The methods disclosed by Babb are complex and involve '80 coefficients' and fourth order polynomials, the coefficients of which must be determined through a rigorous and time-consuming calibration procedure. In tests supervised by the instant inventor, it has been found that $6^{th}$ order polynomials are required to produce accuracy levels that are acceptable in normal use, and that the result is still highly prone to the slightest subsequent variations post-calibration due to thermal drift and the like. In particular it has been found that the corner connections are extreme contributors to long-term coordinate fluctuations, as they act as singularities with a high gain factor with respect to connection size and quality. Furthermore, the method of numerical correction requires high-resolution digital conversions in order to produce even modest resolution outputs. For example it has been found that a 14-bit ADC is required to provide a quality 9-bit coordinate result. The extra expense and power required of the amplifier system and ADC can be prohibitive in many applications.

Problem

Despite the extensive prior work in this field, there is still a need for a low-cost, single-layer, large-area, transparent, low-distortion 2DCT with a relatively low number of external connections.

SUMMARY OF THE INVENTION

The invention provides a two-dimensional position sensor comprising a substrate with a sensitive area defined by a pattern of electrodes including electrodes for determining x-position and electrodes for determining y-position, wherein the x-electrodes and y-electrodes generally extend in the x-direction and are interleaved in the y-direction, and wherein the x-electrodes comprise first, second and third groups of elements shaped such that adjacent ones of the elements of the first and second groups co-extend in the x-direction over one portion of the sensitive area and adjacent ones of the elements of the second and third groups co-extend in the x-direction over another portion of the sensitive area so that the x-electrodes provide respective ratiometric capacitive signals spanning the sensitive area in the x-direction.

The x-electrodes may further comprise a fourth group of elements and adjacent ones of the elements of the third and fourth groups co-extend over a still further portion of the sensitive area so that the x-electrodes provide respective ratiometric capacitive signals spanning the sensitive area in the x-direction.

This principle can be extended to add fifth and further groups of x-electrodes. Topologically, the principle can be extended ad infinitum. However, in reality, the thickness of the electrode feed-throughs to the peripheral edge regions of the sensitive area for external contacting will become thinner and thinner, so at some point it will become impractical to add further groups of x-electrodes as defined by noise considerations and other relevant factors.

In embodiments of the invention a plurality of external electrical lines connect to the electrodes in the periphery of the sensitive area, including: respective electrical lines connected to the elements of each of the groups of x-electrodes; and a plurality of electrical lines connected to the y-electrodes.

In one group of embodiments, a central spine is provided and extends from the periphery of the sensitive area in the y-direction to interconnect the elements of the third group of x-electrodes, which extend from both sides of the central spine, thereby allowing the elements of the third group of x-electrodes to be externally contacted from the periphery of the sensitive area.

Preferably the spine extends continuously across the sensitive area from top to bottom in which case a single external contact would suffice, located either on the top or the bottom of the sensitive area. Alternatively the spine may be split in which case two external contacts would be needed at the periphery of the sensitive area, one on the top and one on the bottom of the sensitive area.

When a spine is provided, the corresponding y-electrodes on either side of the spine at the same height, i.e. same y-position can be commonly connected to save using additional external connection lines. For example, a single external connection line can connect to y-electrodes on either side of the spine by a conductive track running around the periphery of the sensitive area.

In the spine embodiments, a plurality of external electrical lines may be used to connect to the electrodes in the periphery of the sensitive area, including: an electrical line connected to the central spine thereby contacting the third group of x-electrodes, the central spine notionally dividing the sensitive area into left and right sides; an electrical line connected to the elements of the first group of x-electrodes on the left side of the central spine; an electrical line connected to the elements of the first group of x-electrodes on the right side of the central spine; an electrical line connected to the elements of the second group of x-electrodes on the left side of the central spine; an electrical line connected to the elements of the second group of x-electrodes on the right side of the central spine; and a plurality of electrical lines connected to the y-electrodes.

The x-electrodes may be structured in a variety of topographical forms in order to provide the co-extension. For example, the elements of respective groups of x-electrodes which co-extend can have complementary tapers over their distance of co-extension to provide the ratiometric capacitive signals. Alternatively, the elements of respective groups of x-electrodes which co-extend have adjacent blocks of varying area over their distance of co-extension in the x-direction to provide the ratiometric capacitive signals.

By way of example, referring to an embodiment with a central spine and first, second and third groups of x-electrodes, the first and third elements may be tapered to or from the periphery and spine respectively and the second elements possess a double taper to complement the tapers of the first and third elements. Alternatively, in a different implementation of the same embodiment, instead of tapers, the first and third elements may take the form of interconnected blocks of decreasing area to or from the periphery and spine respectively and the second elements have blocks of varying area to complement the blocks of the first and third elements.

The y-electrodes are connected individually and/or in groups to respective external electrical lines, thereby providing position information in the y-direction. This is a simple and reliable approach in which the y-position information is simply deduced from the line on which the signal appears. Additionally if significant signal appears on more than one electrical line, interpolation or some other approximation method can be used. Typically there will not be enough external lines to allow one external line for each y-electrode. Consequently, it will be necessary to gang together adjacent y-electrodes, for example using conductive metal tracks that lead to the external line. For example, the y-electrodes may be grouped in twos, threes or fours.

The y-electrodes may be interconnected by resistive elements so that ratiometric capacitive signals are output through external electrical lines connected to a subset of the y-electrodes, thereby providing position information in the y-direction. In this implementation, the y-electrodes are connected to form a so-called slider, as disclosed in WO 2004/040240. In particular, where the resistive strip overlies a y-electrode it is shorted out by virtue of being in parallel with the conductive electrode, and where it extends between adjacent y-electrodes it provides a resistive interconnection as shown in FIG. 6a of WO 2004/040240. The ratiometric signal can then be picked off by a minimum of two external lines at each end of the slider, i.e. one connected to the top y-electrode and the other connected to the bottom y-electrode. Greater accuracy can be obtained by adding intermediate pick-offs, i.e. adding one or more additional external lines to intermediate y-electrodes. This approach is quite flexible, in that in general the number of external lines available is finite and limited, a typical number is 11. With the slider approach, once the necessary number of external lines are allocated to connect the x-electrodes, the remaining available external lines can all be employed for the y-electrode connections.

The y-electrodes may be arranged in vertically adjacent groups of at least two y-electrodes, with the y-electrodes of each group having differing vertical extents so that ratiometric capacitive signals are output through external electrical lines connected to the different y-electrodes of each group, thereby providing position information in the y-direction. The y-electrodes of each group are preferably directly vertically adjacent, i.e. do not have intervening x-electrodes between them. However, if the x-electrodes have a small extent in the y-direction in comparison to the size of a finger, or other intended actuator, then the group of y-electrodes may have interposed x-electrodes. This ratiometric approach based on varying vertical extent of y-electrodes is disclosed in U.S. Pat. No. 6,288,707, more especially in the FIG. 4 embodiment thereof.

The electrodes can be made of a transparent material, such as indium tin oxide (ITO), or any other suitable material. The substrate can also be made of a transparent material, such as glass or a transparent plastics material, e.g. a polymethyl methacrylate (PMMA) such as Perspex, or a cycloolefin copolymer (COP) such as Zeonor™ or Topas™. However, in some applications, it may be the case that the electrodes and/or the substrate are opaque.

It will be understood that the x- and y-directions are defined by an appropriate coordinate system, most commonly a Cartesian system in which they are orthogonal, although they may be at a non-orthogonal angle. Moreover, in the following the x- and y-directions are sometimes referred to as horizontal and vertical respectively for convenience, although this implies no particular alignment to real space, such as relative to the direction of gravity.

BRIEF DESCRIPTION OF THE DRAWINGS

For a better understanding of the invention and to show how the same may be carried into effect reference is now made by way of example to the accompanying drawings.

DETAILED DESCRIPTION OF A PREFERRED EMBODIMENT

Figure 2:
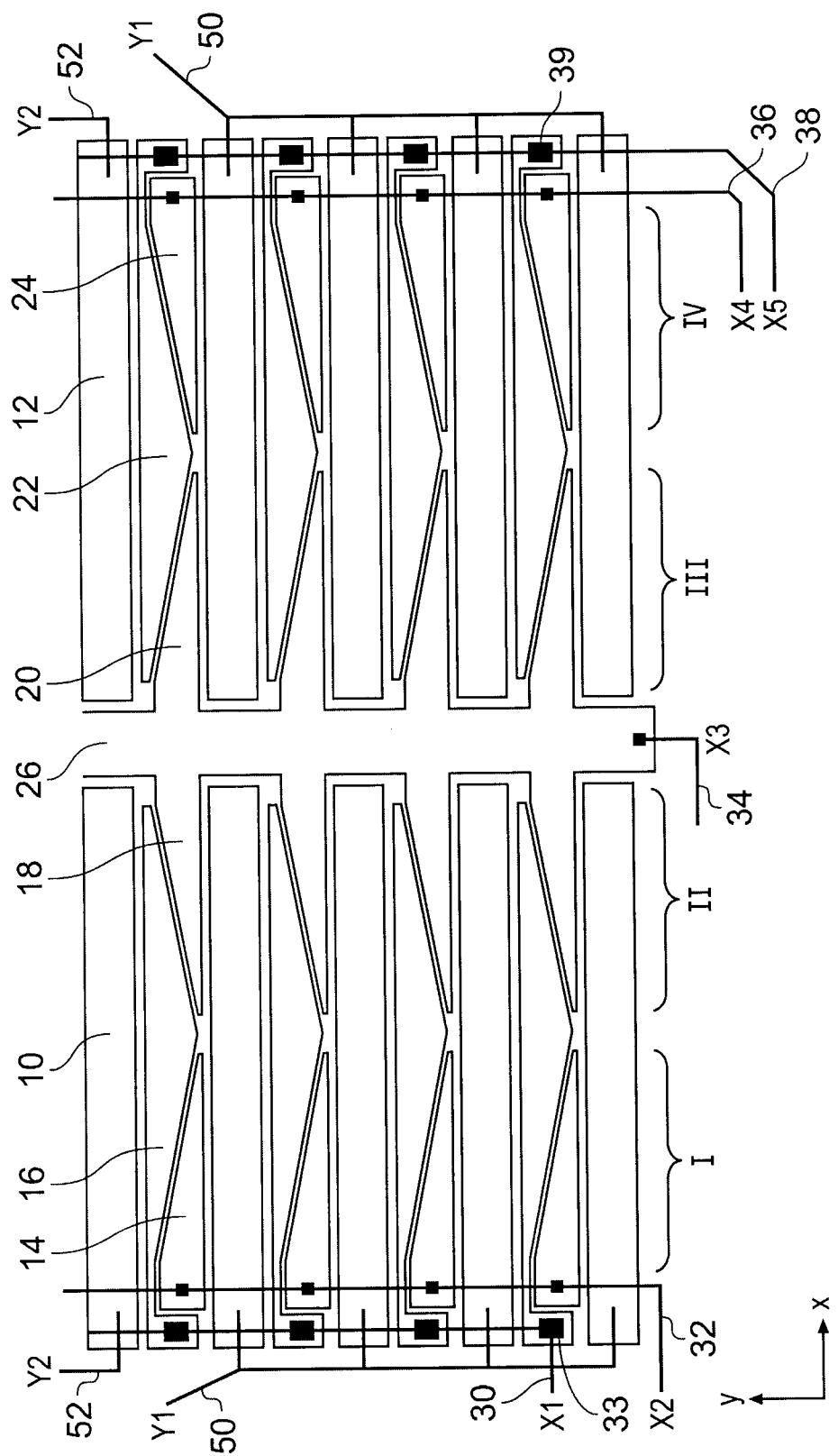
FIG. 2 is a schematic plan view showing parts of an electrode pattern for a 2DCT of a first embodiment of the invention.

FIG. 2 is a schematic plan view showing representative parts of an electrode pattern for a 2DCT of a first embodiment, wherein the electrode pattern define a sensitive area for the device. The electrodes are arranged on a substrate which is not expressly shown, but which has an upper surface lying in the plane of the paper. The substrate may conveniently be a flexible transparent plastics material such as polyethylene terephthalate (PET). The substrate will generally be insulating. The electrode pattern is made of indium tin oxide (ITO) having a resistivity of a few hundred ohm/square. This is a transparent material and thus suitable for display applications, or other applications where an underlying button or other template needs to be visible. More generally, the electrode pattern can be made by depositing or removing any suitable conductive material. Deposition can be by vapor deposition or screen printing, for example. Removal can be by laser or chemical etching, for example.

The electrode pattern defines y-electrodes 10, 12 for determining y-position and x-electrodes 14, 16, 18, 20, 22, 24 for determining x-position. As illustrated, both the x-electrodes and the y-electrodes generally extend in the x-direction and are interleaved in the y-direction. The y-electrodes 10, 12 are shaped as simple bars, i.e. elongate rectangles, whereas the x-electrodes 14-24 have tapered triangular shapes.

The x-electrodes are first described in more detail. A description of the y-electrodes follows.

The x-electrodes can be classified into three groups. A first group of triangular tapered electrodes 14, 24 is arranged at the left and right hand sides of the sensitive area. A second group of triangular electrodes 16, 22 with double tapers is arranged so that the electrodes extend inwards from the left and right hand sides respectively of the sensitive area towards the center. A third group of x-electrodes 18, 20 extend outwardly to the left and right respectively from a central spine 26 which are integrally formed. Adjacent ones of the elements of the first and second groups 14, 16 and 24, 22 co-extend in the x-direction over outer portions I and IV of the sensitive area towards the left and right sides of the sensitive area respectively. Adjacent ones of the elements of the second and third groups 16, 18 and 22, 20 co-extend in the x-direction over inner portions II and III respectively of the sensitive area either side of the central spine.

In this way each adjacent pair of co-extensive x-electrodes of the first and second or second and third groups forms a so-called slider as described in WO 04/040240. Specifically the slider is of the kind illustrated in FIG. 15 of WO 04/040240, the relevant contents of which describing operation of such a slider is incorporated herein by reference. It will be appreciated that the electrode elements are suitably shaped and dimensioned in relation to the actuating device, typically a human finger, to provide a ratiometric capacitive signal spanning the length of their mutual extension in the x-direction, i.e. overlap in the x-direction.

The left-side double-tapered x-electrodes 16 are commonly connected to an external line X1 by a conductive electrical line 30 that runs in the y-direction at the left periphery of the sensitive area close to the leftmost edge of the x-electrodes 16. It is noted that the double-taper electrodes have a bonding pad areas 33 at their leftmost ends to facilitate this external connection.

The left-side tapered x-electrodes 14 are commonly connected to an external line X2 by a conductive electrical line 32 that runs in the y-direction at the left periphery of the sensitive area close to the leftmost edge of the x-electrodes 14.

The tapered x-electrodes 18 and 20 that depend from the central spine 26 are of course commonly connected by the spine and have electrical contact to the periphery of the sensitive area through the spine 26. An external line X3 connects to the central spine through an electrical line 34 contacted to the base of the spine 26.

The right-side tapered x-electrodes 24 are commonly connected to an external line X4 by a conductive electrical line 36 that runs in the y-direction at the right periphery of the sensitive area close to the rightmost edge of the x-electrodes 24 in similar fashion to the corresponding left-side x-electrodes 14.

The right-side double-tapered x-electrodes 22 are commonly connected to an external line X5 by a conductive electrical line 38 that runs in the y-direction at the right periphery of the sensitive area close to the rightmost edge of the x-electrodes 22 in similar fashion to the corresponding left-side x-electrodes 16 with the aid of enlarged bonding pad areas 39. In this way, the x-electrodes 14-24 are externally contacted to five external lines X1-X5 for read out.

The y-electrodes are split into two sets 10 and 12 to the left and right of the central spine 26. As already mentioned, they have a simple bar shape and are arranged between each adjacent set of x-electrodes 14, 16, 18 on the left and 20, 22, 24 on the right. The y-electrodes 10 and 12 are connected in vertically adjacent sets by conductive electrical lines, so the y-resolution of the sensitive area is in this embodiment limited to a vertical distance corresponding to the vertical extent of the interconnected y-electrodes. This ganging together of the y-electrodes reduces the y-resolution, but is done to keep down the number of external lines needed for the y-electrodes. In the illustrated example, the bottom set of y-electrodes, consisting of four pairs of y-electrodes, are commonly connected to an electrically conducting track 50 that forms part of an external line Y1. Although not evident from this figure, each pair of y-electrodes at the same height are commonly connected by an external run-around track. The next set up consists of three pairs of y-electrodes, although only the first pair is visible, and is connected to a track 52 for a further external line Y2. In total there are seven sets of y-electrodes connected to respective external lines Y1-Y7 through associated conductive tracks. In this embodiment, the y-value is taken from these seven external lines providing only 7 units of y-resolution for a simple control algorithm, although possibly additional y-resolution could be achieved with interpolation between adjacent y lines.

To summarize, the 2DCT provides quasi-continuous x-resolution through sliders arranged in four overlap regions I-IV in the x-direction spanning across the width of the sensitive area in combination with step-like y-resolution through horizontally extending electrode bars commonly connected in vertically adjacent sets of 3 and 4. In total 12 external lines are used, 5 for X and 7 for Y.

The combination of the central spine and the double-taper electrodes allows a large extent of the sensitive area in the x-direction to provide a large sensitive area that can be made transparent and free of external connections except at the periphery. Moreover, the electrode pattern design means that handshadow effects are not significant, since any shift in the centroid of the capacitive signal from the physical location of the finger is bounded by the lateral extent of the electrodes. For example, a device with a 6 inch (150 mm) diagonal sensitive area can be made to this design.

Figure 3:
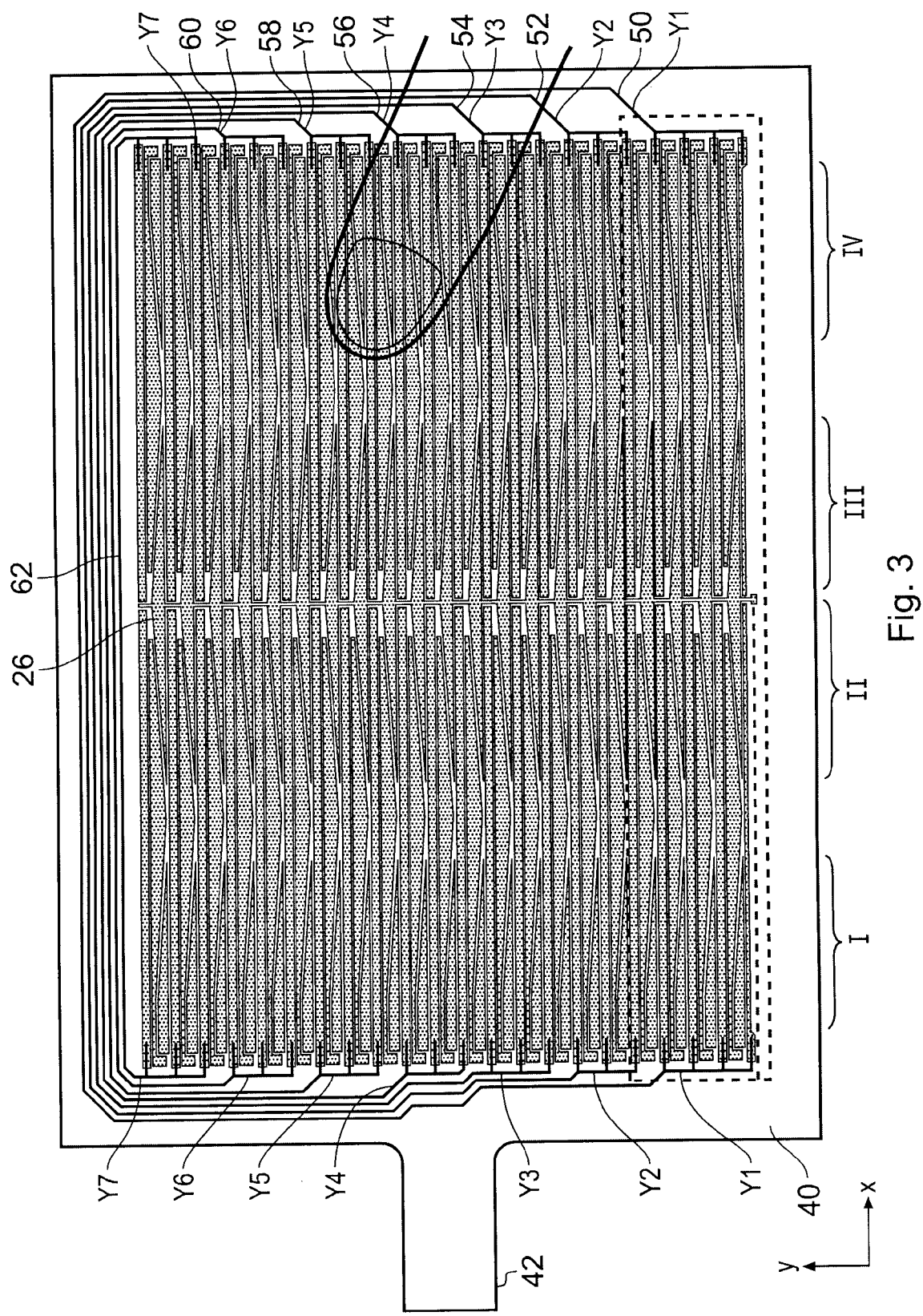
FIG. 3 is a plan view of a 2DCT prototype according to the first embodiment showing the electrode pattern and a first layer of connections at the periphery of the electrode pattern area to connect to the y-electrodes.

FIG. 3 is a plan view to scale, with a scale of 1:1—i.e. real size—of a 2DCT prototype according to the first embodiment showing the electrode pattern and a first layer of connections at the periphery of the electrode pattern area to connect to the y-electrodes. For ease of reference, the area covered by the previous schematic figure is shown by the dotted rectangle at the bottom of the figure. A finger outline roughly to scale is also shown.

The general ITO electrode pattern is evident that covers the main part of the substrate 40. The pattern in this example covers a rectangular area which matches the area of the touch screen or other device which it is to form the sensing part. The previously described four overlap regions I-IV of the x-electrodes are also marked. The substrate 40, which is generally rectangular, also has a neck tab 42 mid way up the left side of the substrate. The neck tab 42 is used for external contacting as described with reference to a subsequent figure. On the left hand side of the substrate 40, the side adjacent the neck tab 42, it will be seen that there are seven groups of conducting tracks 50-62 forming external lines Y1-Y7 for the y-electrodes, with lines Y2-Y7 each being connected to three y-electrodes via the tracks 52-62 and Y1 connecting four y-electrodes via track 50, there being 22 y-electrodes in total on this left half of the device, i.e. the half to the left of the central spine 26. On the right hand side there is an exactly corresponding arrangement with 22 y-electrodes ganged in three's apart from at the bottom where four are ganged together. The tracks 50-62 of the external lines Y1-Y7 on the right hand side of the substrate run around the top of the substrate to the left hand side of the substrate so that the left and right side corresponding pairs, and commonly connected groups of pairs, of y-electrodes are joined by a single conductive track.

Figure 4:
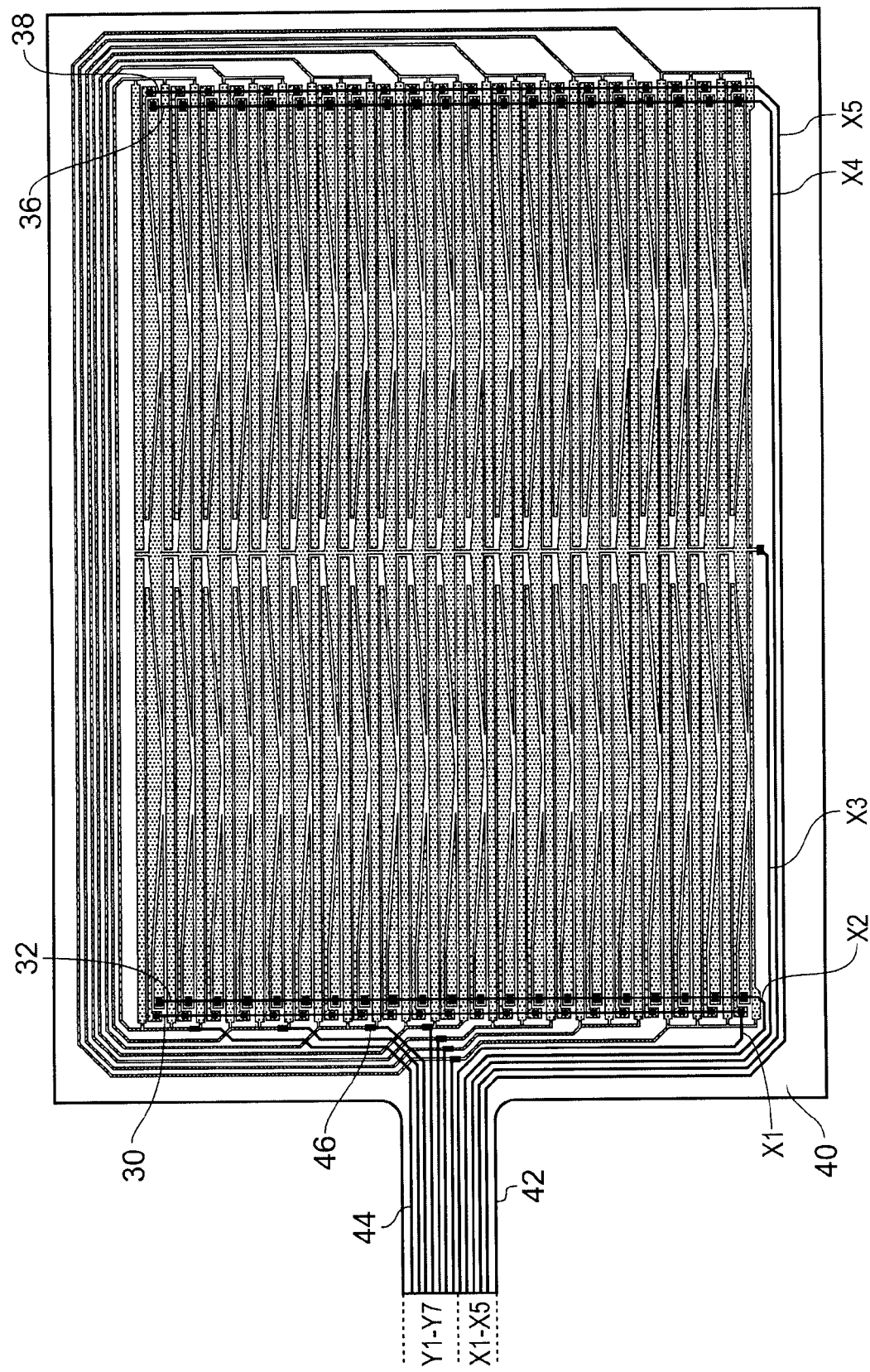
FIG. 4 is a plan view of the 2DCT prototype of FIG. 3 showing the electrode pattern and a second layer of connections at the periphery of the electrode pattern area to connect to the x-electrodes and also to connect the y-electrode external feed lines to the y-electrode connections shown in FIG. 3.

FIG. 4 is a plan view of the 2DCT prototype of FIG. 3 showing the electrode pattern and a second layer of connections at the periphery of the electrode pattern area to connect to the x-electrodes and also to connect the y-electrode external feed lines to the y-electrode connections shown in FIG. 3. In between the first and second layers of FIGS. 3 and 4, there is interposed an insulating layer which provides insulating areas to prevent electrical contact between certain parts of the first and second connection layers and open areas to ensure electrical contact between certain other parts of the first and second connection layers.

The y-electrode connections are described first. Seven conductive tracks 44 extend in parallel in the x-direction along the upper part of the neck tab 42 onto the left side part of the main area of the substrate 40. They then fan out and terminate with an enlarged contact pad 46 directly above a part of the tracks 50-62 in the first connection layer of FIG. 3 for each of the y-electrode connections Y1-Y7 so that signals to and from each of the y-electrode groups can be fed in and out through the external contact tracks 44. There are open areas in the insulating layer at each contact pad 46 to ensure electrical contact between each of the Y1-Y7 tracks 44 on the second connection layer and the Y1-Y7 electrical line tracks 50-62 in the first connection layer. There are also insulating areas in the insulating layer covering each of the Y1-Y7 tracks where they overlie the ITO pattern to contact the y-electrodes both on the left and right hand sides of the substrate.

The x-electrode connections are now described. The five electrical lines 30-38 for external connections X1-X5 were already described with reference to FIG. 2 and can be seen in the second connection layer of the prototype in FIG. 5. As can be seen, the x-electrode connections are entirely provided for on the second connection layer, in contrast to the y-electrode connections which are distributed between the first and second connections layers. Namely, the tracks 30-38 run around the bottom side of the substrate 40 and then come together in 5 parallel tracks that are directed to the neck tab 42 where they join the 7 parallel y-electrode connections. It is noted that the x-electrode connection tracks and pads that run vertically up each side of the ITO area to contact the x-electrodes are electrically isolated from the y-electrode connection tracks by the insulating layer.

Figure 5:
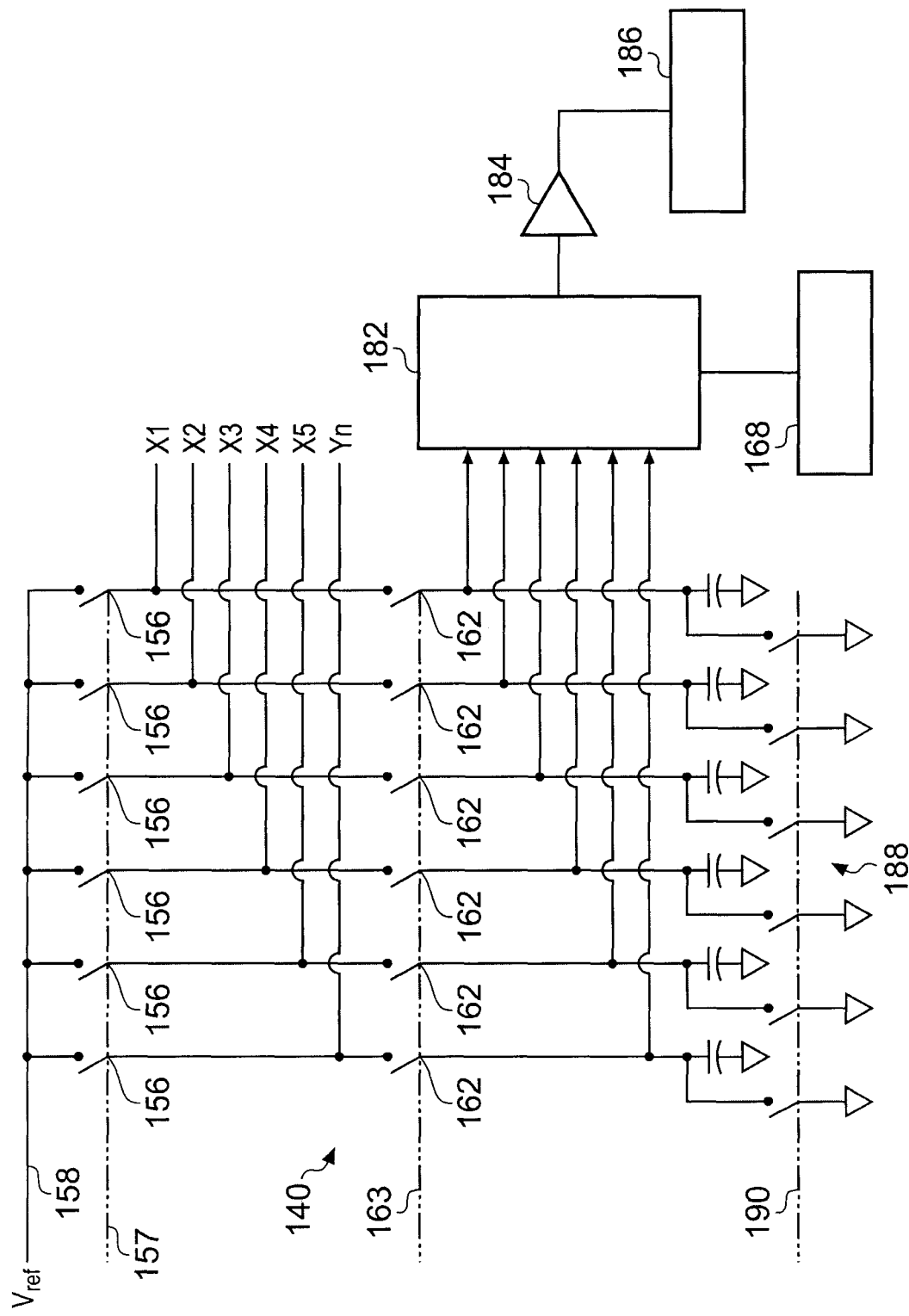
FIG. 5 is a schematic system level drawing of drive and data acquisition circuitry for the first embodiment.

FIG. 5 is a schematic system level drawing of a multichannel sensor circuit 140 for use with the touch screen of the first embodiment. In this figure the sensor circuit 140 is depicted as having five capacitive electrode inputs X1, X2, X3, X4 and X5 from the x-electrodes, and a single capacitive electrode input $Y_n$ representative of the seven y-electrode inputs. In reality there will be seven such lines, one for each y-electrode input to provide the required 12 lines in total. A charging control line 157 is used to simultaneously charge all the capacitive inputs X1-X5 and Y1-Y7 using charging switches 156 connected to a reference voltage rail 158.

In a variant, the charging control line 157 is omitted and the charging switches 156 replaced with a pull-up resistor constantly connecting the various electrodes to the voltage supply. The pull-up resistor has a resistance chosen to provide an RC time constant greater than the discharge interval used to discharge the layer into the array of charge detectors. This resistance can be between fifteen and twenty five thousand ohms for example.

The channels X1-X5 and Y1-Y7 act simultaneously when transferring charge to the charge detectors, as indicated in the figure, by the use of a single discharging control line 163 actuating discharge switches 162 to discharge all the charged electrodes. After the transfer, or burst of transfers, has occurred, an analogue multiplexer 182 selects which of the charge detector capacitor outputs is to be fed to the amplifier 184 and ADC 186 under control of a microprocessor 168 and thence to external control and data acquisition circuitry, typically a PC. Additionally, an array of reset switches 188 controlled by a reset control line 190 is activated after each pulse or burst of pulses to reset the capacitive inputs to a known reference (e.g., to ground). It will be clear to those skilled in the art many of the circuit elements of each channel sensor have been omitted from the figure in the interest of clarity. In respect of the x-channels X1-X5, these will need to be driven and the signals processed to take account of the ratiometric information that needs to be obtained from these signals, using the "slider" approaches described in prior art patent publications from Harald Philipp, such as WO 04/040240 and U.S. Pat. No. 6,288,707. Further details of the sensor circuitry and the methods of driving the sensor circuitry with bursts and so forth are available in the prior art patent publications from Harald Philipp, such as WO 04/040240, U.S. Pat. No. 6,288,707 and U.S. Pat. No. 5,730,165.

In summary of the first embodiment, it will now be appreciated that this design has a centrally symmetric electrode pattern with a central spine dividing the sensor area into left and right halves. The central spine forms the "trunk" of a Christmas tree, with the "branches" of the tree being single taper electrodes extending out from either side of the trunk to co-extend with the second taper of two sets of twin-taper electrode that are externally connected to the sides of the sensor area, the first tapers of which co-extend with a further two single-taper electrode sets that are also externally connected to the sides of the sensor area. These electrodes, which are all for sensing in the horizontal direction are interleaved in the vertical direction with bars that are externally connected to the sides of the sensor area and form vertical position sensing electrodes. The sensing area operates with 12 external connections, five for the horizontal sensing connected to each of the taper electrode sets, and seven for the 22 vertical electrode rows, this reduction being achieved by commonly connecting vertically adjacent groups of 3 or 4 vertical electrode rows in order to reduce the total number of external connections at the expense of loss of vertical resolution. Moreover, it has been described how the structure has 4 layers, two for the connections, one insulating layer to control connection between the two connection layers and an electrode pattern layer which may be dispensed with and formed directly on one of the connection layers.

A second embodiment of the invention is now described. In most respects, the second embodiment is the same as the first embodiment. The same ITO electrode pattern is used. Moreover, the external connections for the x-electrodes is exactly the same, so that the electrode pattern layer and first conductive layer are exactly the same. The difference between the second embodiment and first embodiment lies in the y-sensing. In the first embodiment, the electrode bars provide discrete y-position information with a resolution defined by the vertical separation of the y-electrode bars, or in the case when multiple adjacent y-electrode bars are commonly connected to reduce the number of external connection lines, by the vertical separation of each group of commonly connected y-electrode bars. In the second embodiment, the same y-electrode arrangement is used, i.e. horizontal bars interleaved between the x-electrodes, but the y-electrode bars are resistively connected to each other in a so-called "slider" arrangement of WO 04/040240 to allow quasi-continuous position information in the vertical direction to be obtained by connection to suitable external measurement circuitry.

Figure 6:
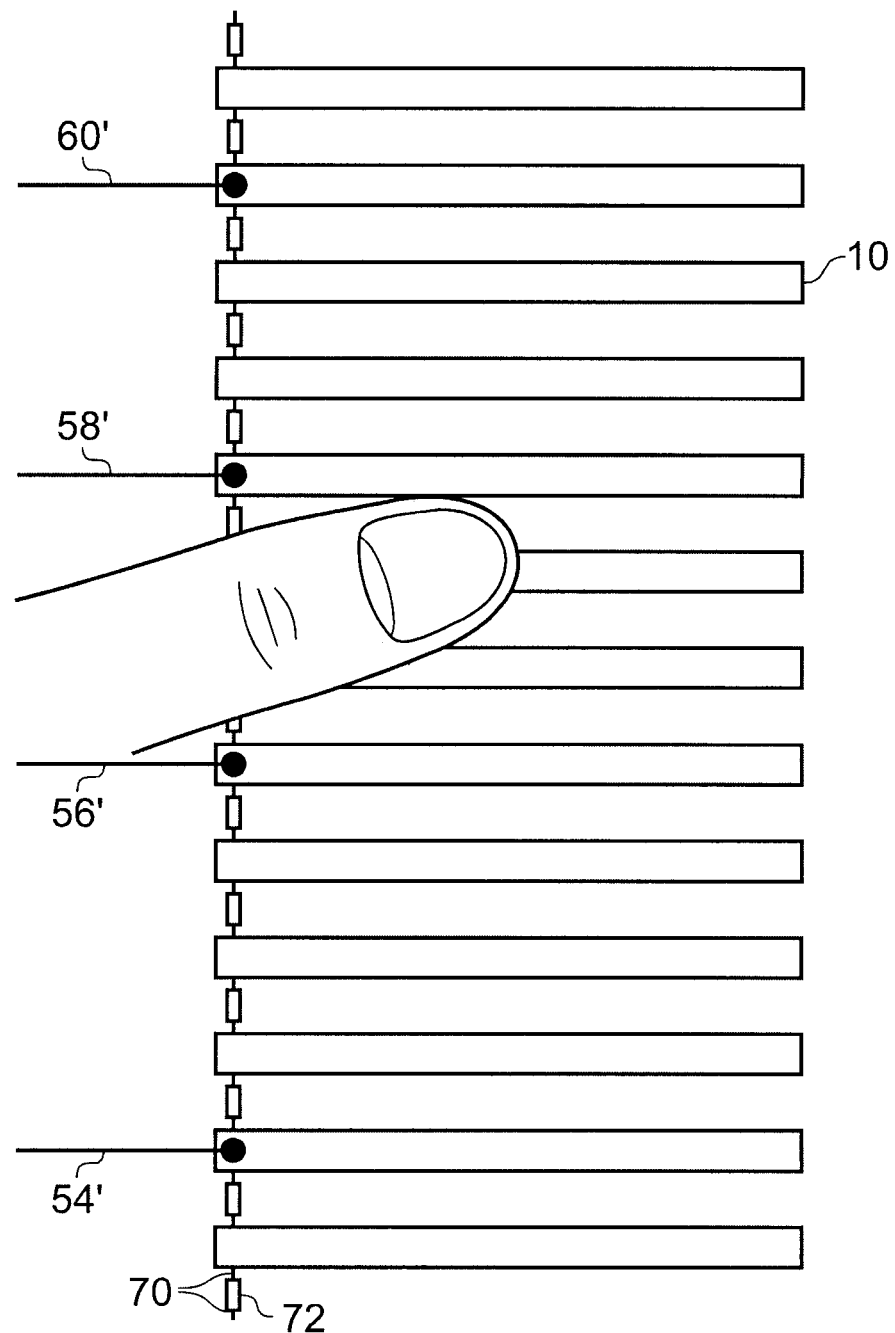
FIG. 6 is a schematic plan view showing parts of an electrode pattern and y-connections for a 2DCT of a second embodiment of the invention.

FIG. 6 is a schematic plan view showing parts of an electrode pattern and y-connections for a 2DCT of a second embodiment of the invention. A person's finger roughly to scale is also shown. The x-electrodes and their external connection tracks are omitted for clarity. The figure shows a middle portion of the left half of the sensing area which, similar to the first embodiment, has a number of vertically offset y-electrode bars 10, thirteen being illustrated. Each bar is connected to its vertically adjacent bar or bars by an electrically conductive, i.e. metallic, lines 70 with a discrete resistor 72 in series with it. The y-electrode bars 10 are externally connected via conductive tracks which lead to external connection lines for the Y sensing. In the figure four such external connection lines 54'-60' are shown connected to every third or fourth y-electrode.

Electrically, the resistors 72 and their interconnects 70 provide a resistive path between the adjacent y-electrode bars 10, and this resistive path extends between vertically adjacent pairs of conductive external connection lines 54' and 56', 56' and 58' etc. (In the case of any one pair of adjacent lines, e.g. 54' and 56', this is electrically identical to a slider of the embodiment of FIG. 6a of WO 04/040240). Ratiometric analysis is used to detect y-position as described in WO 04/040240, for example using measurement circuitry as described in WO 04/040240 or other measurement circuitry known in the art for this purpose.

In general there must be a minimum of two such external connections in the second embodiment which form end connections of the slider. These end connections should preferably be connected to the top-most and bottom-most y-electrode, or at least ones near the top and bottom. It is also beneficial to provide one or more additional external connections between these two end connections to improve y-position sensing accuracy by effectively forming multiple sliders along the y direction. Usually there will be a desire imposed by cost to limit the number of external connections to a fixed number, in which case as many y-electrode external connections can be provided as there are spare external lines after allocation of sufficient lines for the x-electrodes.

Figure 7:
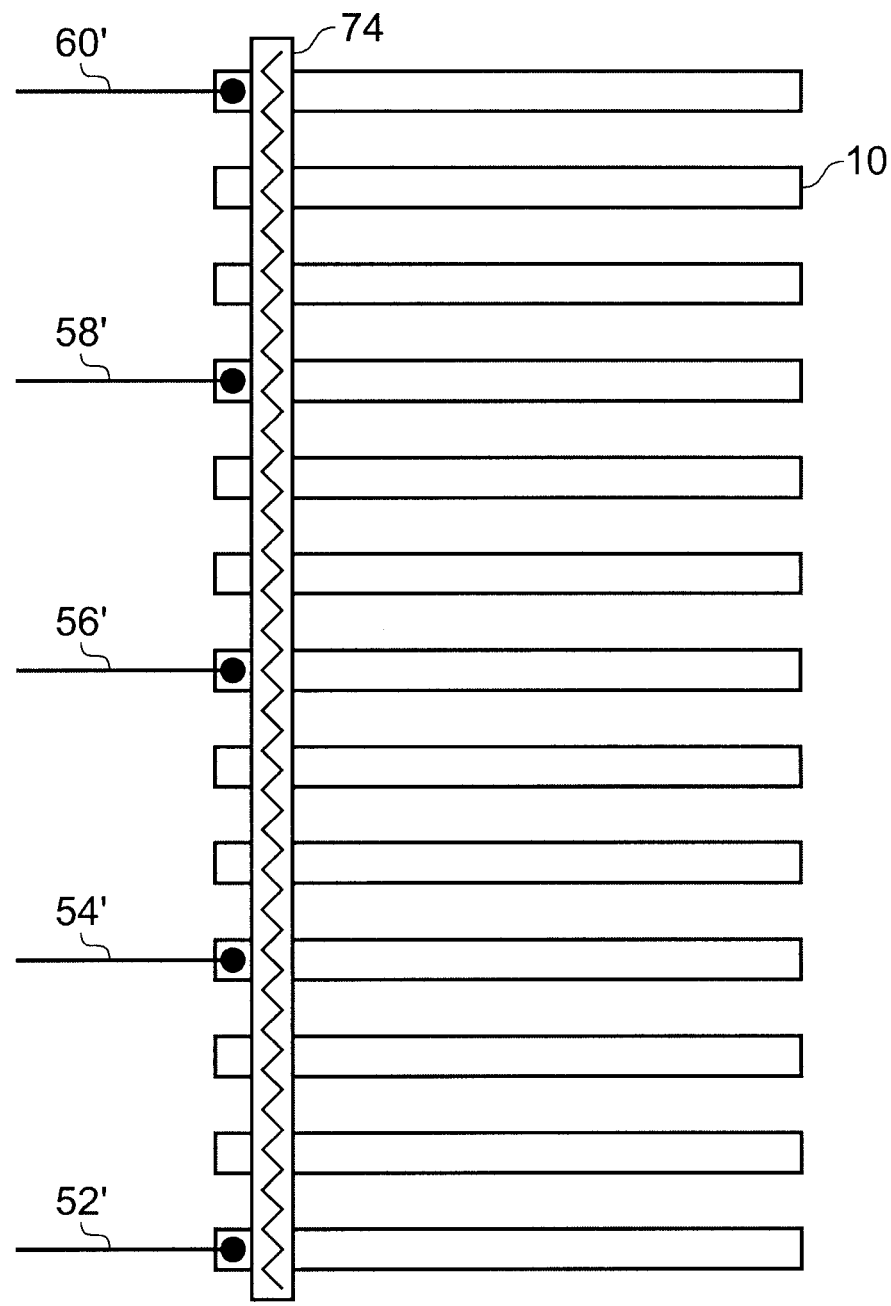
FIG. 7 is a schematic plan view similar to FIG. 6 showing parts of an electrode pattern and y-connections for a variant of the second embodiment.

FIG. 7 is a schematic plan view similar to FIG. 6 showing parts of an electrode pattern and y-connections for a variant of the second embodiment. The y-electrode bars 10 and external connection lines 52'-60' serve the same functions as described with reference to FIG. 6. In this variant, instead of using discrete resistors to connect vertically adjacent y-electrodes, a resistive strip 74 of uniform resistance per unit length (in the y-direction) is provided extending vertically over each of the y-electrode bars. Since the electrode bars are essentially metallic, i.e. conductive, the parts of the resistive strip overlying the y-electrodes are electrically inactive, since, as viewed in the vertical direction, they are effectively connected in parallel with the y-electrode and thus shorted out. The parts of the resistive strip in between each y-electrode bar thus form a resistive path between each y-electrode in the same way as the discrete resistors of FIG. 6. The resistive strip 74 is made of a high-resistance film, for example a carbon-based thick film.

Figure 8:
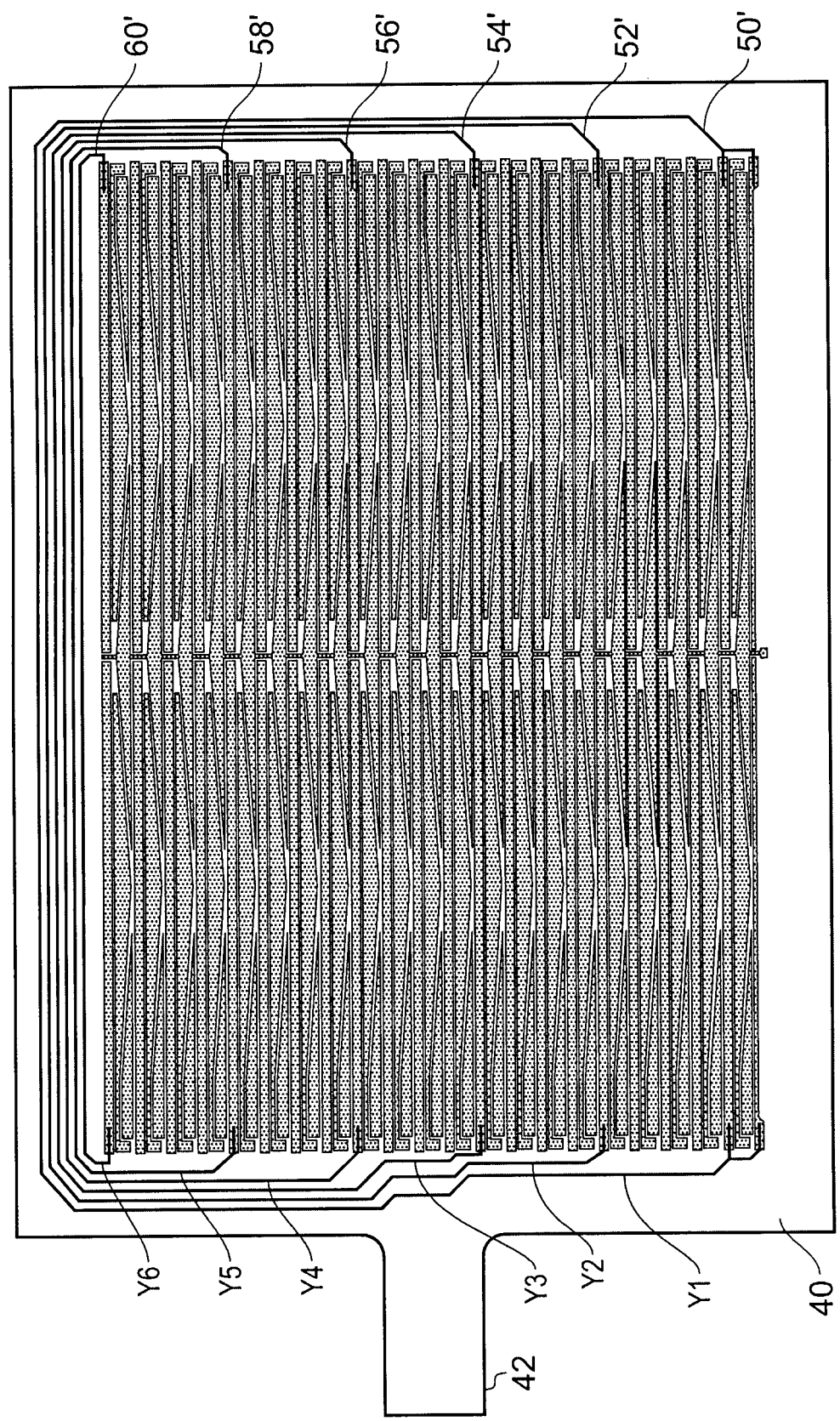
FIG. 8 is a plan view of a 2DCT prototype according to the second embodiment showing the electrode pattern and a first layer of connections at the periphery of the electrode pattern area to connect to the y-electrodes.

FIG. 8 is a plan view of a 2DCT prototype according to the second embodiment showing the electrode pattern and a first layer of connections at the periphery of the electrode pattern area to connect to the y-electrodes. FIG. 8 is to be compared with FIG. 3 for the first embodiment. Essentially the substrate 40 with neck tab 42 carries the same structure, the only differences being that only every third or fourth y-electrode is connected by the external connection lines 50'-60' with the common connection of the first embodiment being omitted. An exception is the bottom two y-electrodes which are commonly connected to electrical track 50'. Moreover, it is noted that the y-electrodes are served by a total of six external lines Y1-Y6, rather than seven.

Figure 9:
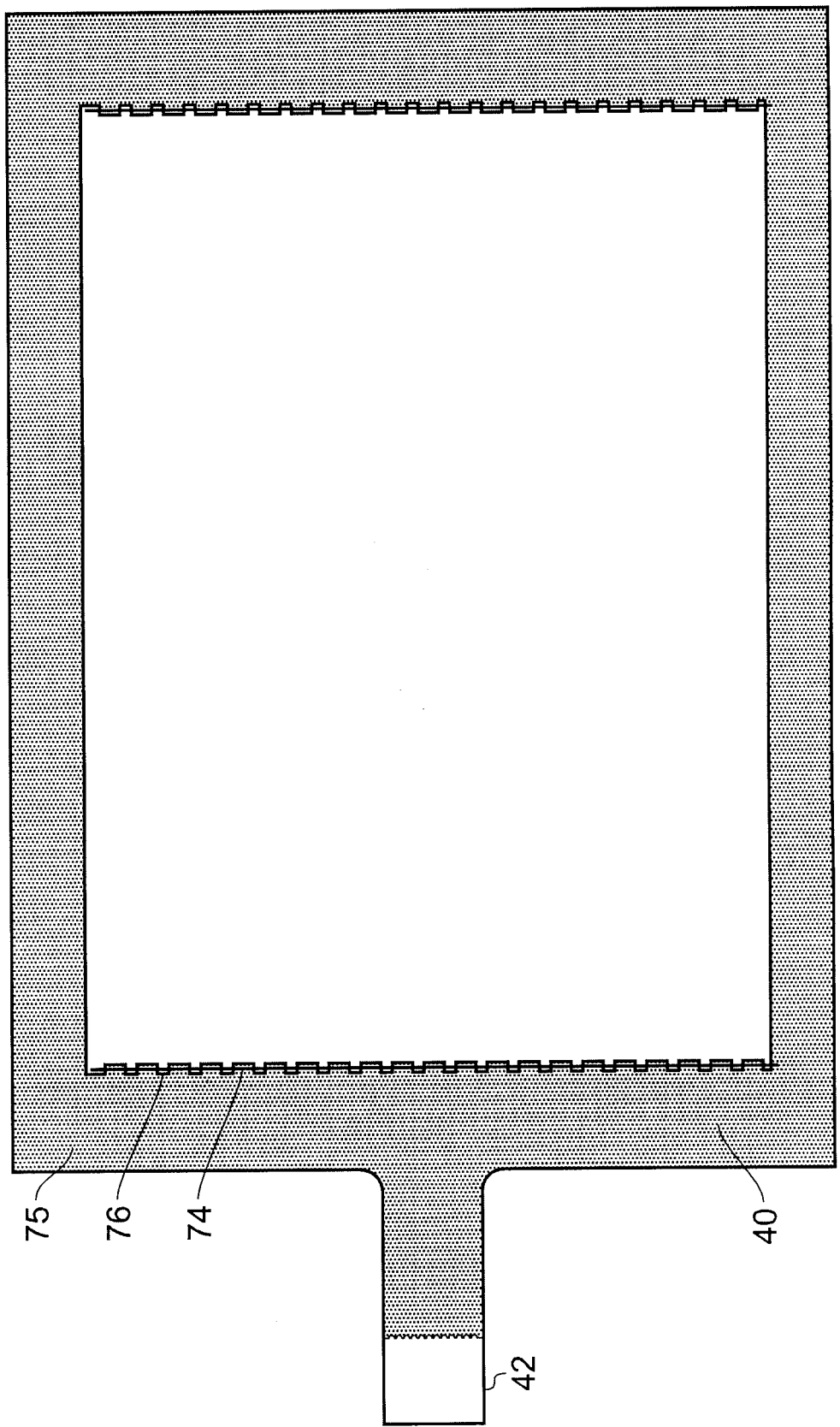
FIG. 9 is a plan view of a 2DCT prototype according to the second embodiment showing a resistive layer to connect resistive elements between the y-electrodes.

FIG. 9 is a plan view of a 2DCT prototype according to the second embodiment showing a resistive layer to connect resistive elements between the y-electrodes. This layer is particular to the second embodiment and provides the resistive path 74 extending vertically up each side of the sensing area over the ends of the outer ends of the y-electrode bars. Each vertically extending resistive path 74 is formed by a single track of material of suitable resistivity. It is noted that this layer also is partially covered with highly resistive material 75 (gray shading) which covers the peripheral regions of the substrate and also a part of the neck tab adjacent to the main part of the substrate. The resistive material terminates in a castellated or crenellated formation 74 that alternates back and forth over the associated resistive material path 75, so that the resistive path 75 directly connects to outer end portions of each of the y-electrode bars, but is covered where it crosses the ends of the x-electrodes, thereby preventing undesired electrical interaction with the x-electrodes. An alternative would be to have a meandering path 74, e.g. following a castellated or crenellated path to avoid crossing the x-electrode ends.

Figure 10:
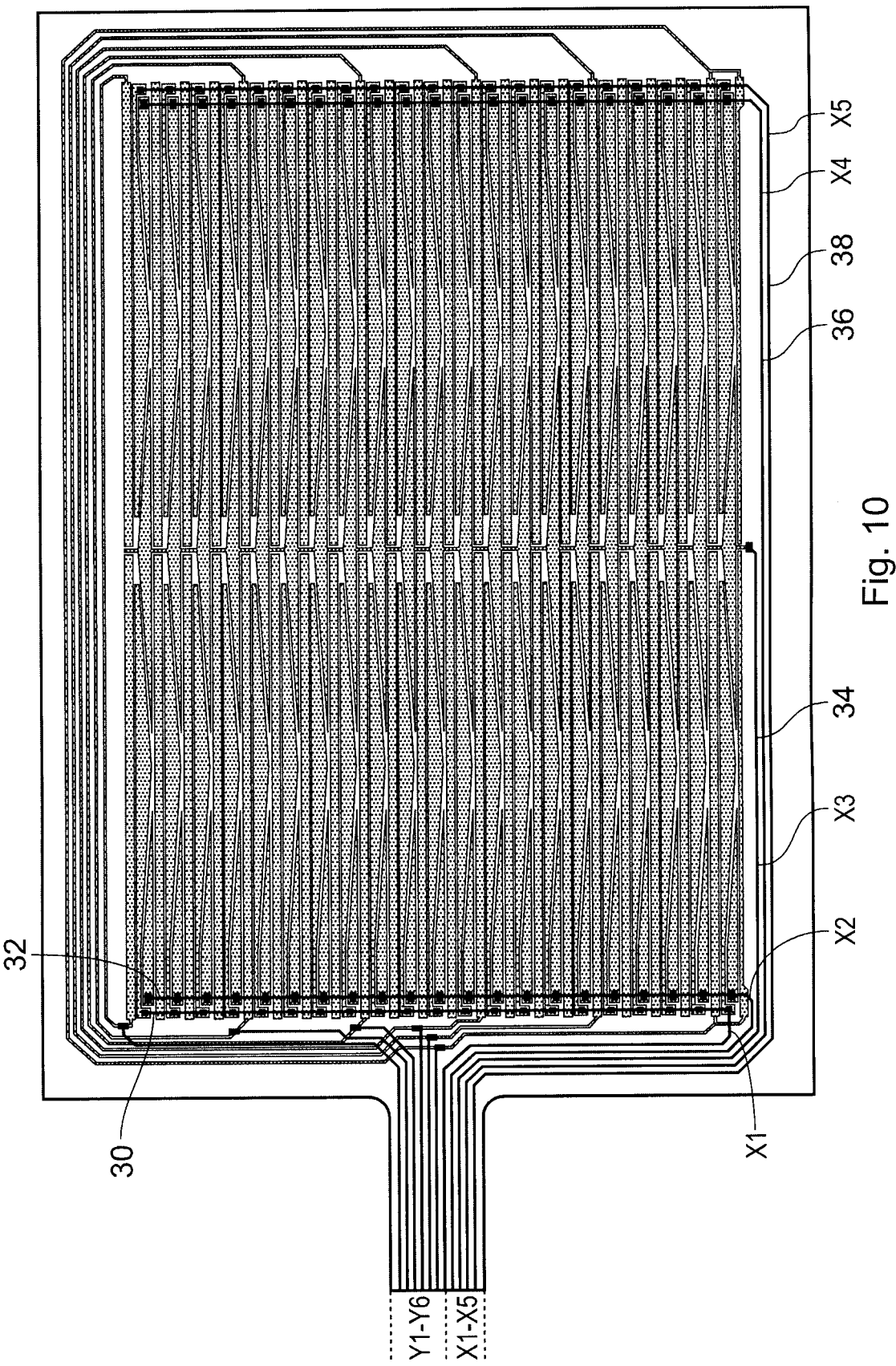
FIG. 10 is a plan view of the 2DCT prototype of FIG. 8 showing the electrode pattern and a second layer of connections at the periphery of the electrode pattern area to connect to the x-electrodes and also to connect the y-electrode external feed lines to the y-electrode connections shown in FIG. 8.

FIG. 10 is a plan view of the 2DCT prototype of FIG. 8 showing the electrode pattern and a second layer of connections at the periphery of the electrode pattern area to connect to the x-electrodes and also to connect the y-electrode external feed lines to the y-electrode connections shown in FIG. 8. This is almost identical to FIG. 4 of the first embodiment, except for the fact that there is one fewer Y lines. Namely, the x-electrode external connections X1-X5 and associated tracks 30-38 are the same, as are the external connection lines 44 for the Y external connections Y1-Y6 that extend from the neck tab 42 to connect with the matching tracks of the first connection layer (except for the fact that there are one fewer in this second embodiment). Moreover, the insulating layer is provided with suitable open areas and insulating areas similar to in the first embodiment.

The drive and data acquisition circuitry will be similar to as described above in relation to the first embodiment except in this case "slider"-type handling of the y-electrode signals will be needed as well as for the x-electrode signals. As already mentioned, suitable circuitry is described in prior patent publications in the name of Harald Philipp, such as WO 04/040240, U.S. Pat. No. 6,288,707 and U.S. Pat. No. 5,730,165.

Figure 11:
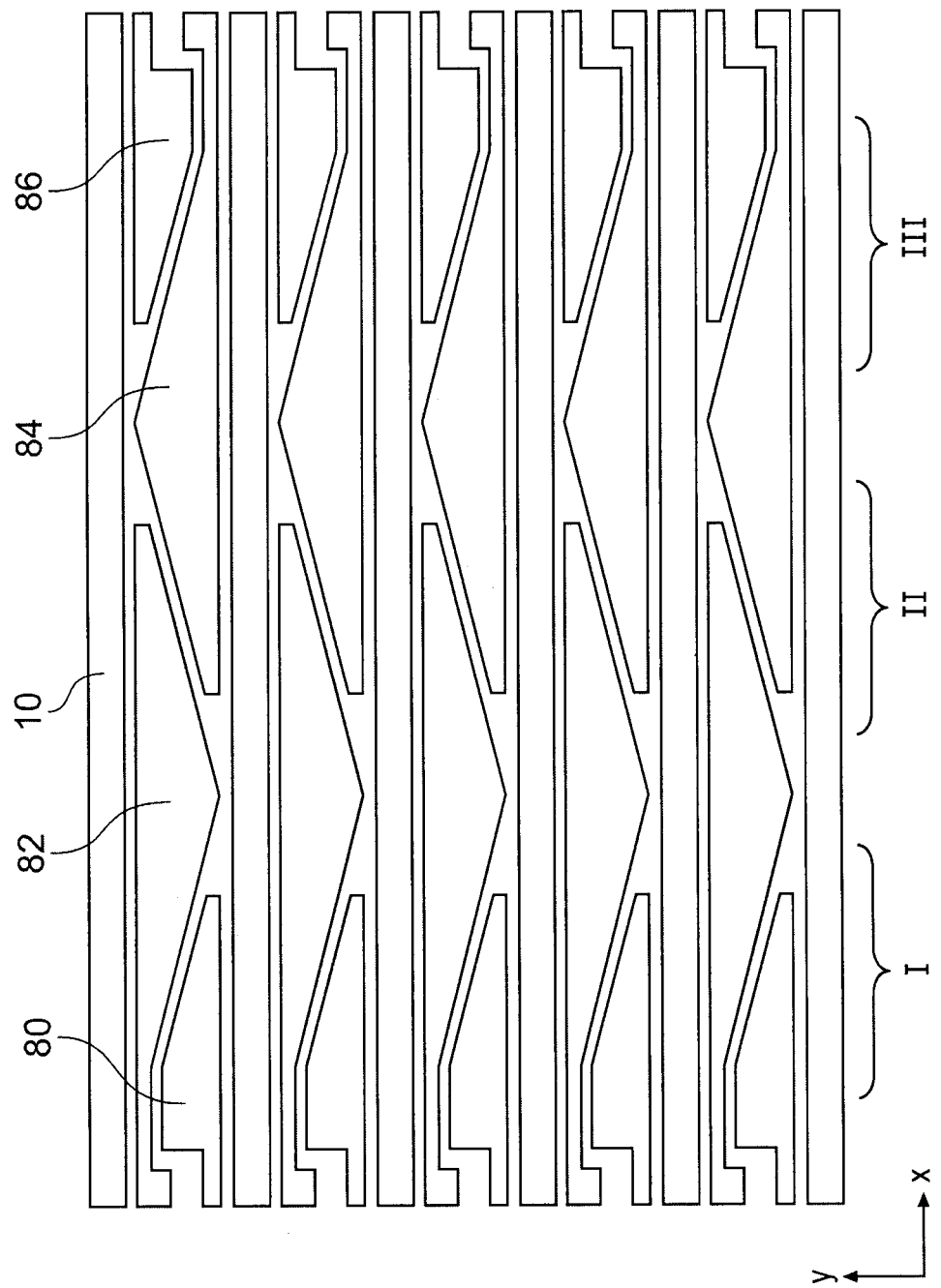
FIG. 11 is a schematic plan view showing parts of an electrode pattern for a third embodiment.

FIG. 11 is a schematic plan view showing parts of an electrode pattern for a third embodiment. Unlike the first and second embodiment, the third embodiment has no central spine. Instead the central portion of the sensing area is defined by a region of co-extent of the groups of double-taper electrodes that externally contact to the left and right sides of the device. Referring to the figure, the y-electrodes 10 are single bars each extending across from one side of the sensing area to the other in the absence of a central spine. The y-electrodes 10 may be contacted either exclusively from the left side or right side, or partly from either side, or redundantly from both sides. The x-electrodes are arranged between each vertically adjacent pair of y-electrodes 10 and are made up of four groups of x-electrodes 80, 82, 84 and 86. The x-electrode groups 80 and 86 are single taper electrodes extending respectively from the left and right sides of the sensing area. The x-electrode groups 82 and 84 are double taper electrodes also extending respectively from the left and right sides of the sensing area. The sensitive part of the sensing area for x-resolution is formed by three portions of mutual extension of the different x-electrode groups, namely a first portion I on the left side of the sensitive area defined by co-extension in the x-direction of x-electrode groups 80 and 82, a second portion II in the central region of the sensitive area defined by co-extension in the x-direction of the dual taper x-electrode groups 82 and 84, and a third portion II on the right side of the sensitive area defined by co-extension in the x-direction of x-electrode groups 84 and 86. In this way each adjacent pair of co-extensive x-electrodes of the first and second, or second and third, or third and fourth groups forms a so-called slider as described in WO 04/040240. The external connections are similar to the first and second embodiments, and for this reason are not shown again here. However, it will be noted that there will be four external connection lines X1-X4 needed for the x-electrodes. For the y-electrodes, the same considerations apply as for the first and second embodiments. In this respect, it is noted that for the third embodiment, the y-electrode addressing may follow either the first or the second embodiment.

Figure 12:
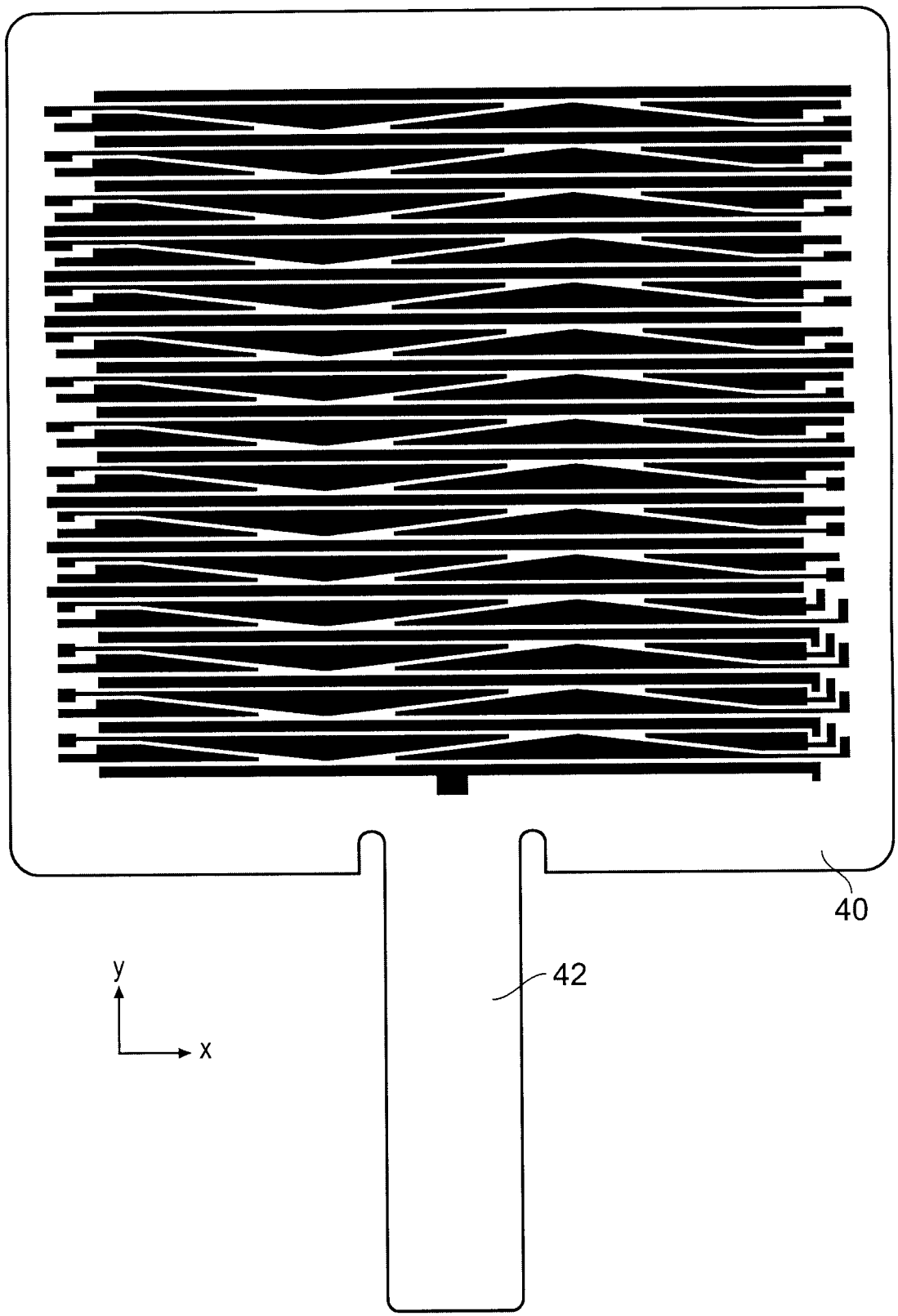
FIG. 12 is a plan view of a 2DCT prototype according to the third embodiment showing the electrode pattern.

FIG. 12 is a plan view of a 2DCT prototype according to the third embodiment showing the electrode pattern. This adopts the pattern structure of FIG. 12 with 15 rows of x-electrode sets interleaved with 16 rows of y-electrode bars. It is also noted that the substrate 40 has its neck stub 42 arranged on the bottom side, which for this embodiment is a more convenient allocation. The bottom four y-electrode bars are commonly connected (following the approach of the first embodiment) and the other y-electrode bars are commonly connected in groups of three to provide a y-resolution limited to five discrete rows that are connected to external measurement circuits with five lines Y1-Y5. An improvement in y-resolution would be achieved by modifying the prototype to follow the approach of the second embodiment. Each of the four x-electrode groups has its own external line X1-X4 respectively. There are thus nine external connection lines in total. For brevity the other layers of the prototype are not shown for this embodiment, but it will be understood that generally similar approaches are adopted as for the first and second embodiments.

Figure 1:
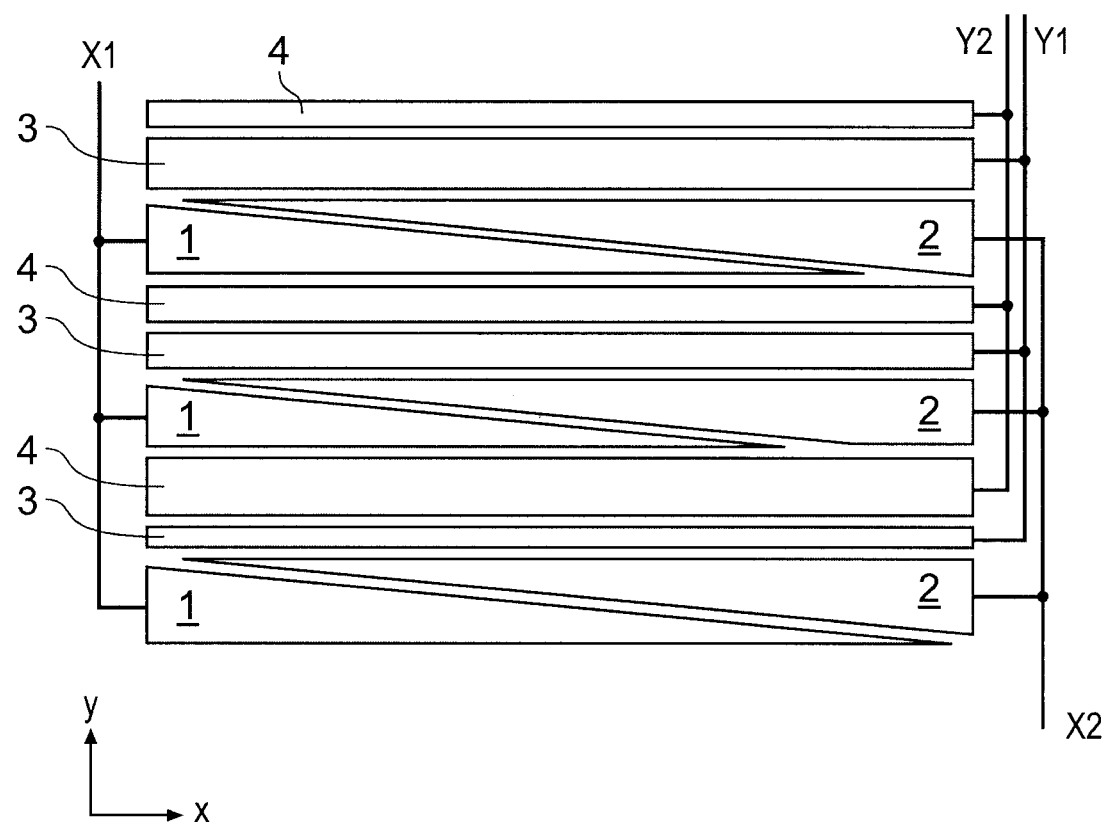
FIG. 1 is a schematic plan view showing a prior art electrode pattern for a 2DCT.
Figure 13:
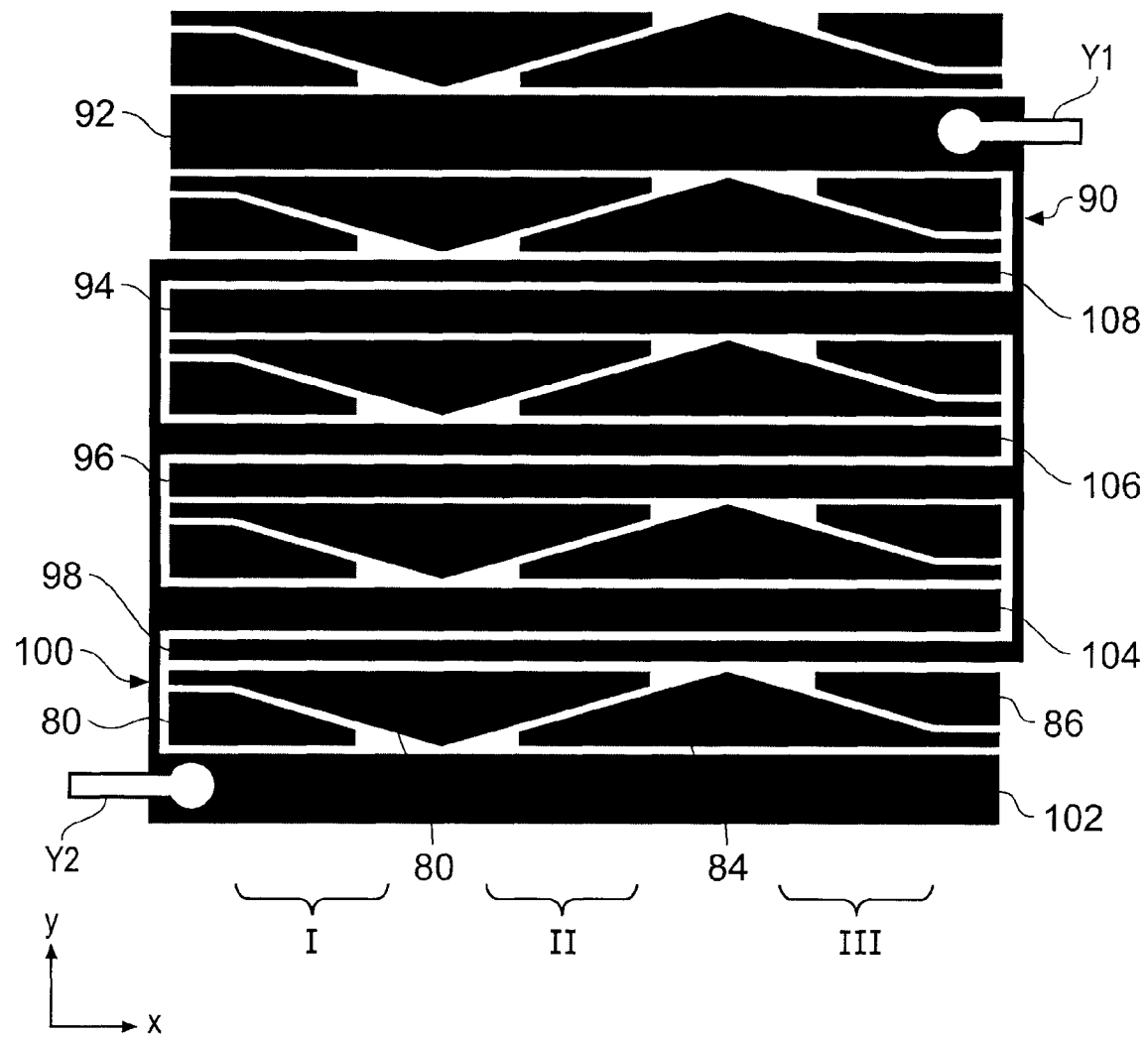
FIG. 13 is a schematic plan view showing parts of an electrode pattern for a fourth embodiment.

FIG. 13 is a schematic plan view showing parts of an electrode pattern for a fourth embodiment. The x-electrodes 82, 84, 86, 88 are arranged in the same manner as in the third embodiment to provide three x-position sensitive columns of x-electrode overlap I, II and III. (In an alternative, the x-electrodes could be arranged as in the first and second embodiments.) However, in the fourth embodiment the y-electrodes have a different arrangement to the previous embodiments. Namely, in the fourth embodiment the y-electrodes follow the prior art ratiometric pairing approach illustrated in FIG. 1 of the accompanying drawings, i.e. the y-electrode structure shown FIG. 4 of U.S. Pat. No. 6,288,707.

In this arrangement, for each unit of the electrode pattern, between each adjacent row of x-electrodes 82, 84, 86, 88 there are pairs of neighboring independently addressed y-electrodes of differing area, so that when a user's finger or other actuator is proximal these y-electrodes the two neighboring independently addressed y-electrodes provide respective signals that have a magnitude that scales with their relative areas. The ratio between these signals is made characteristic of y-position within each y-electrode unit by varying the relative areas of the neighboring pairs of independently addressed y-electrode bars in each row. In the illustrated example, each unit has 5 y-electrode rows with the area ratios from top to bottom of 1:0, 1:2, 1:1, 2:1, 0:1, wherein the first value is of signal derived from a first set 90 of commonly connected y-electrodes 92, 94, 96, 98 and the second value is of signal derived from a second set 100 of commonly connected y-electrodes 102, 104, 106, 108. A zero value indicates that for that row the y-electrode is formed solely of a y-electrode from the other set, which is the case in this example for the top and bottom y-electrode row of each unit. The first set 90 are externally connected to line Y1 and the second set 100 to line Y2. Each further electrode pattern unit will need a further two external Y-connections. For example, in a sensor using the electrode pattern unit illustrated in FIG. 13, with 15 rows of y-electrodes and 14 rows of x-electrodes, there will be 3 units requiring six Y-connections Y1-Y6 and four X-connections X1-X4, i.e. 10 in total.

In principle, any number of y-electrode rows can be grouped into a unit with two sets of commonly addressed y-electrodes. However, in practice, the number will be limited by accuracy constraints. The number of y-electrode rows per unit is at least 3, but may be 4, 5 (as in the illustration), 6, 7, 8, 9, 10 or more.

It will be appreciated that although in the illustrated example pairs of y-electrodes are used in principle 3 or more y-electrodes could be used and their relative areas used to encode position in which case for a given noise level it would be possible to make larger units, i.e. units in which greater numbers of rows can be addressed by a single pair of external y-position connections.

Moreover, although it is convenient for the processing circuitry to create a smoothly varying ratio of surface area with y-position in each unit as in the illustrated example, in principle this variance could be arbitrary with y with suitable processing circuitry.

The Y set consists of alternating Y1-connected and Y2-connected rectangular stripes, 3 and 4 respectively, having a y-axis dimension that varies with placement in such a manner so as to create a smoothly varying ratio of surface area between Y1 and Y2 with location Y. The sum of each adjacent pair of the y-axis stripes 3 and 4 is made constant so that the sum of the capacitance is the same for any two paired stripes, i.e., C(Y1)+C(Y2)=C(Y) for each pair of stripes. Then, as the user's fingers move along the y-axis, the larger capacitance value becomes the numerator.

Figure 14:
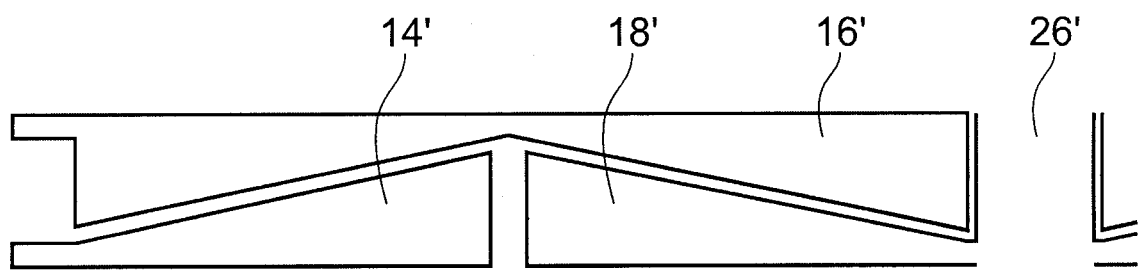
FIG. 14 is a schematic plan view showing parts of an electrode pattern for a fifth embodiment.

FIG. 14 is a schematic plan view showing a part of an electrode pattern for a fifth embodiment. The pattern here differs from those of the previous embodiments in that the shape of the double-taper x-electrodes 16' are inverted from a "stork bill" to a "bow tie" shape in which the taper is towards the middle of the double taper instead of away from the middle. This double-taper shape is shown with reference to an embodiment with a spine 26' although it could also be used in spineless designs. The single taper x-electrodes 14', 18' are correspondingly inverted to form the necessary co-extension with the bowtie double taper electrode 16'.

Figure 15:
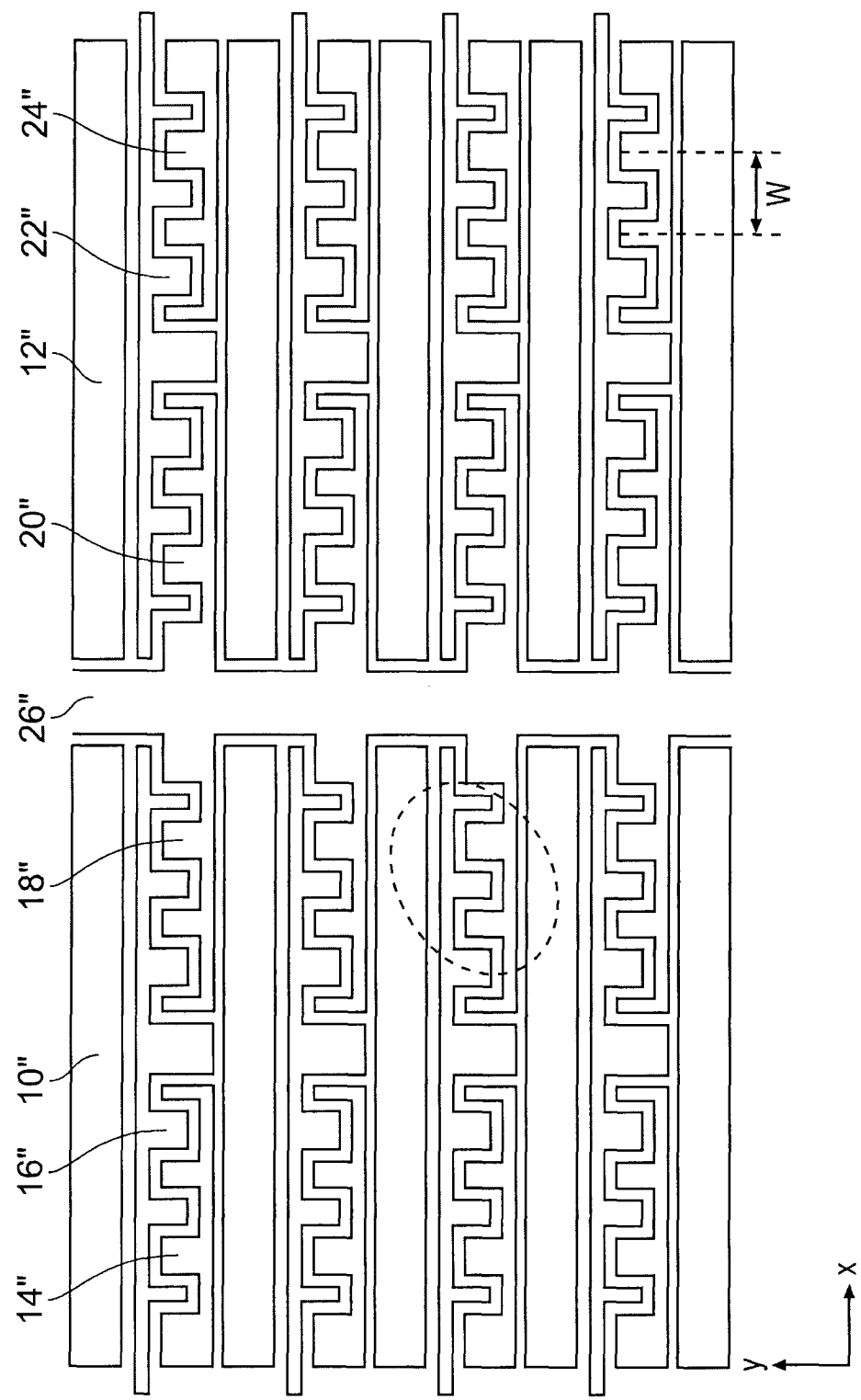
FIG. 15 is a schematic plan view showing parts of an electrode pattern for a sixth embodiment.

FIG. 15 is a schematic plan view showing parts of an electrode pattern for a sixth embodiment. This embodiment can be understood by comparison with the first embodiment illustrated in FIG. 2. As in the first embodiment, the sensing area is divided into left and right halves by a central spine 26". The y-sensing is performed by left and right side y-electrode bars 10" and 12" which are interleaved with rows left and right side x-electrodes 14", 16", 18" and 20", 22", 24" respectively. It is noted that the same reference numbers are used for reference numerals of corresponding electrodes with a double prime added for the sixth embodiment.

Although the general arrangement of the x- and y-electrodes is the same as for the first embodiment, and also the shape of the y-electrodes is the same, the shape of the x-electrodes differs. Instead of a smooth triangular tapering to form the regions of co-extension, the x-electrodes have a crenellated shape in which the co-extension between x-electrode groups 14" and 16", 16" and 18", 20" and 22", and 22" and 24", is formed by an interdigitation in the y-direction, whereby adjacent blocks from co-extending electrode pairs have defined ratios of areas specific to the x-position. The desired x-dependent change in the ratiometric signals derived from the co-extending pairs of x-electrodes is still achieved in view of the area ratios provided in the y-direction through the interdigitated shape provided that the actuation area, e.g. finger contact area, is of an appropriate size, as indicated schematically in the figure with the dashed oval on the left half of the sensing area. The interdigitated arrangement may be preferable for a sensor area that is principally used for arrays of buttons, since it provides a stepwise change in x-position information corresponding to the width of each interdigitated unit, indicated as 'w' in the figure. In this way, both the x- and y-position information can be given a stepwise sensitivity which is the preferred implementation for a button array. In the illustrated example, it can be seen that there will be 14 steps in the x-position ratiometric signals, seven on each side of the spine 26".

This kind of embodiment with stepwise sensitivity in both horizontal and vertical directions to subdivide the sensitive area notionally into a rectangular grid is to be contrasted with the second or fourth embodiments where there is quasi-continuous sensitivity in both horizontal and vertical provided by "slider" type configurations of both the x- and y-electrodes.

Figure 16:
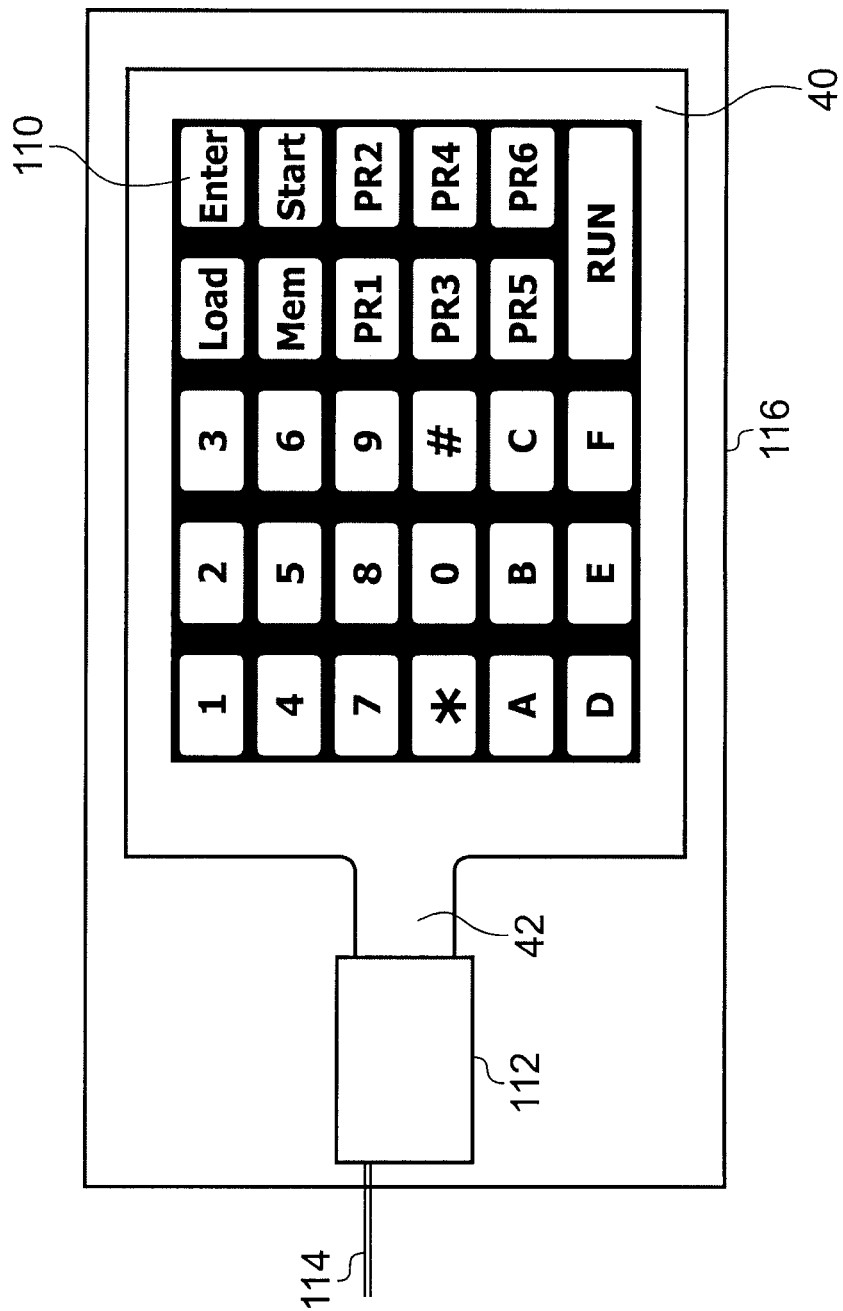
FIG. 16 is a schematic plan view of a glass touch panel device incorporating a 2DCT embodying the invention.

FIG. 16 is a schematic plan view of a glass touch panel device incorporating a 2DCT according to any of the above-described embodiments of the invention. The previously described 2DCT sensor area carried on substrate 40 is attached to the underside of a glass panel 116, for example of 5 mm thickness, with a button pattern sheet 110 sandwiched between the underside of the glass panel 116 and the substrate 40. The button pattern sheet 110 is a static printed sheet, but in other cases could be substituted with a display device which might dynamically change between multiple button patterns and/or displays with continuum features, such as a projection of an elongate bar for controlling some scalar quantity, such as power or time, that is relevant for control of the device that the 2DCT is incorporated in. In general, the panel 116 need not be glass, but could be any suitable dielectric material. Usually it will be transparent to allow integration with a static or dynamic display. The panel will typically form part of a larger device, such as the door of a microwave oven, the top panel of a cooker, or the housing of a handheld workflow tracking device for field use by service personnel.

By way of example, the button pattern sheet 110 is illustrated as showing an array conforming to a 5×6 grid, with a double-size button in the bottom right corner thereby to provide a total of 30-1=29 buttons. The external connection lines from the sensor area are supplied to an measurement circuit carried by a printed circuit board (PCB) 112 through the neck tab 42. The measurement circuit PCB is attached to the end of the neck tab 42 and also fixed to the underside of the glass panel 116. Electrical cabling 114 connects the measurement circuit to further digital electronics and a power supply.

It will be appreciated that 2DCTs embodying the invention may incorporate a variety of additional features. For example, in some applications it is desirable to have a 'wakeup' function, whereby the entire device 'sleeps' or is in some quiescent or background state. In such cases, it is often desirable to have a wake signal from mere proximity of a human body part some distance away. The element can be driven as a single large capacitive electrode without regard to position location, while the unit is in the background state. During this state the electronic driver logic looks for a very small change in signal, not necessarily enough to process as a 2D coordinate, but enough to determine that an object or human is in proximity. The electronics then 'wakes up' the overall system and the element is driven so as to become a true 2DCT once again.

What is claimed is:

1. A position sensor comprising:
a plurality of x-electrodes that generally extend in an x-direction; and
a plurality of y-electrodes that generally extend in the x-direction and are interleaved with the x-electrodes in a y-direction that is substantially perpendicular to the x-direction, the x-electrodes and y-electrodes being arranged together in a pattern that defines a sensitive area, none of the y-electrodes being adjacent to another one of the y-electrodes in the y-direction, the plurality of y-electrodes being arranged in y-electrode groups of at least two y-electrodes, the y-electrodes of each y-electrode group being connected to each other, one or more of the x-electrodes each being adjacent to one or more other ones of the x-electrodes in the y-direction, the x-electrodes comprising first, second, and third groups of elements, the elements in each of the first, second, and third groups of elements being connected to each other but not to elements in another one of the groups, the elements in the first, second, and third groups having shapes configured for:
adjacent ones of the elements in the first and second groups to co-extend in the x-direction over a first portion of the sensitive area and to provide ratiometric capacitive signals with respect to each other in the x-direction; and
adjacent ones of the elements in the second and third groups to co-extend in the x-direction over a second portion of the sensitive area and to provide ratiometric capacitive signals with respect to each other in the x-direction.

2. The position sensor of claim 1, wherein the x-electrodes comprise a fourth group of elements that have shapes, along with the shapes of the elements in the third group, configured for adjacent ones of the elements in the third and fourth groups to co-extend over a third portion of the sensitive area and to provide ratiometric capacitive signals with respect to each other in the x-direction.

3. The position sensor of claim 1, further comprising a plurality of external electrical lines connected to ones of the x-electrodes and y-electrodes that are in a periphery of the sensitive area, first ones of the external electrical lines being connected to the elements in the groups of x-electrodes, second ones of the external electrical lines being connected to the y-electrodes.

4. The position sensor of claim 1, further comprising a central spine extending from a periphery of the sensitive area in the y-direction to interconnect the elements in the third group of x-electrodes, the elements in the third group of x-electrodes extending from one or both sides of the central spine for the elements in the third group of x-electrodes to be externally contacted from the periphery of the sensitive area.

5. The position sensor of claim 4, further comprising a plurality of external electrical lines connected to ones of the x-electrodes and y-electrodes that are in the periphery of the sensitive area, the external electrical lines comprising:
 a first electrical line connected to the central spine thereby contacting the third group of x-electrodes, the central spine notionally dividing the sensitive area into left and right sides;
 a second electrical line connected to the elements in the first group of x-electrodes on the left side of the central spine;
 a third electrical line connected to the elements in first group of x-electrodes on the right side of the central spine;
 a fourth electrical line connected to the elements in the second group of x-electrodes on the left side of the central spine;
 a fifth electrical line connected to the elements in the second group of x-electrodes on the right side of the central spine; and
 one or more sixth electrical lines connected to the y-electrodes.

6. The position sensor of claim 1, wherein adjacent, co-extending ones of the elements have complementary tapers over their distance of co-extension.

7. The position sensor of claim 1, wherein adjacent, co-extending ones of the elements have blocks of varying area over their distance of coextension in the x-direction.

8. The position sensor of claim 1, wherein the y-electrodes are connected individually or in groups to respective external electrical lines to provide position information in the y-direction.

9. The position sensor of claim 1, wherein the y-electrodes are interconnected by resistive elements for ratiometric capacitive signals to be output through external electrical lines connected to a subset of the y-electrodes to provide position information in the y-direction.

10. The position sensor of claim 1, wherein the y-electrodes of each y-electrode group having differing vertical extents for ratiometric capacitive signals to be output through external electrical lines connected to the different y-electrodes of each y-electrode group to provide position information in the y-direction.

11. The position sensor of claim 1, wherein the electrodes are made of a transparent material.

12. The position sensor of claim 1, wherein the substrate is made of a transparent material.

13. The position sensor of claim 11, wherein the transparent material comprises indium tin oxide (ITO).

14. The position sensor of claim 12, wherein the transparent material comprises polyethylene terephthalate (PET).

15. A device comprising:
 a position sensor comprising:
  a plurality of x-electrodes that generally extend in an x-direction; and
  a plurality of y-electrodes that generally extend in the x-direction and are interleaved with the x-electrodes in a y-direction that is substantially perpendicular to the x-direction, the x-electrodes and y-electrodes being arranged together in a pattern that defines a sensitive area, none of the y-electrodes being adjacent to another one of the y-electrodes in the y-direction, the plurality of y-electrodes being arranged in y-electrode groups of at least two y-electrodes, the y-electrodes of each y-electrode group being connected to each other, one or more of the x-electrodes each being adjacent to one or more other ones of the x-electrodes in the y-direction, the x-electrodes comprising first, second, and third groups of elements, the elements in each of the first, second, and third groups of elements being connected to each other but not to elements in another-one of the groups, the elements in the first, second, and third groups having shapes configured for:
   adjacent ones of the elements in the first and second groups to co-extend in the x-direction over a portion of the sensitive area and to provide ratiometric capacitive signals with respect to each other in the x-direction; and
   adjacent ones of the elements in the second and third groups to co-extend in the x-direction over another portion of the sensitive area and to provide ratiometric capacitive signals with respect to each other in the x-direction,
 circuitry configured to drive and process information from the position sensor.

16. The device of claim 15, wherein the x-electrodes comprise a fourth group of elements that have shapes, along with the shapes of the elements in the third group, configured for adjacent ones of the elements in the third and fourth groups to co-extend over a third portion of the sensitive area and to provide ratiometric capacitive signals with respect to each other in the x-direction.

17. The device of claim 15, further comprising a plurality of external electrical lines connected to ones of the x-electrodes and y-electrodes that are in a periphery of the sensitive area, first ones of the external electrical lines being connected to the elements in the groups of x-electrodes, second ones of the external electrical lines being connected to the y-electrodes.

18. The device of claim 15, further comprising a central spine extending from a periphery of the sensitive area in the y-direction to interconnect the elements in the third group of x-electrodes, the elements in the third group of x-electrodes extending from one or both sides of the central spine for the elements in the third group of x-electrodes to be externally contacted from the periphery of the sensitive area.

19. The device of claim 18, further comprising a plurality of external electrical lines connected to ones of the x-electrodes and y-electrodes that are in the periphery of the sensitive area, the external electrical lines comprising:

a first electrical line connected to the central spine thereby contacting the third group of x-electrodes, the central spine notionally dividing the sensitive area into left and right sides;

a second electrical line connected to the elements in the first group of x-electrodes on the left side of the central spine;

a third electrical line connected to the elements in first group of x-electrodes on the right side of the central spine;

a fourth electrical line connected to the elements in the second group of x-electrodes on the left side of the central spine;

a fifth electrical line connected to the elements in the second group of x-electrodes on the right side of the central spine; and one or more sixth electrical lines connected to the y-electrodes.

20. The device of claim 15, wherein adjacent, co-extending ones of the elements have complementary tapers over their distance of co-extension.

* * * * *

UNITED STATES PATENT AND TRADEMARK OFFICE
CERTIFICATE OF CORRECTION

PATENT NO.        : 8,619,054 B2                                     Page 1 of 1
APPLICATION NO.   : 11/752615
DATED             : December 31, 2013
INVENTOR(S)       : Harald Philipp et al.

It is certified that error appears in the above-identified patent and that said Letters Patent is hereby corrected as shown below:

In the Claims

Col. 20, Ln. 40: After "x-direction" delete "," and insert --; and--.

Signed and Sealed this
Seventh Day of October, 2014

Michelle K. Lee
*Deputy Director of the United States Patent and Trademark Office*